United States Patent
Miyamoto

(10) Patent No.: US 7,006,933 B2
(45) Date of Patent: Feb. 28, 2006

(54) SEMICONDUCTOR MODULE FOR OUTPUTTING POWER LOSS

(75) Inventor: Noboru Miyamoto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 203 days.

(21) Appl. No.: 10/318,145

(22) Filed: Dec. 13, 2002

(65) Prior Publication Data

US 2004/0004502 A1  Jan. 8, 2004

(30) Foreign Application Priority Data

Jul. 5, 2002  (JP)  ............................. 2002-197419

(51) Int. Cl.
*G01R 21/06* (2006.01)
(52) U.S. Cl. ............................. 702/60; 702/64; 702/80
(58) Field of Classification Search .................. 702/60, 702/62, 64, 65, 80
See application file for complete search history.

(56) References Cited

U.S. PATENT DOCUMENTS

| | | | | |
|---|---|---|---|---|
| 4,835,706 A * | 5/1989 | Asahi | ........................... | 700/293 |
| 5,057,760 A * | 10/1991 | Dadpey et al. | .............. | 318/807 |
| 5,481,456 A * | 1/1996 | Ogura | ............................ | 701/1 |
| 5,481,460 A | 1/1996 | Masaki et al. | ................. | 701/50 |
| 5,633,577 A * | 5/1997 | Matsumae et al. | ............. | 322/37 |
| 5,778,997 A | 7/1998 | Setaka et al. | .............. | 180/65.2 |
| 5,844,399 A * | 12/1998 | Stuart | ........................... | 323/282 |
| 5,872,737 A * | 2/1999 | Tsuruda et al. | ......... | 365/189.05 |
| 6,018,694 A | 1/2000 | Egami et al. | ................. | 701/102 |
| 6,051,893 A * | 4/2000 | Yamamoto et al. | ............ | 307/43 |
| 6,052,632 A * | 4/2000 | Iihoshi et al. | .................. | 701/36 |
| 6,163,180 A * | 12/2000 | Hidaka et al. | ............... | 327/112 |
| 6,286,065 B1 * | 9/2001 | Suzuki | .......................... | 710/69 |
| 6,297,624 B1 * | 10/2001 | Mitsui et al. | ................ | 323/316 |
| 6,320,275 B1 * | 11/2001 | Okamoto et al. | ........... | 307/10.1 |
| 6,710,574 B1 * | 3/2004 | Davis et al. | ................. | 318/800 |
| 6,717,785 B1 * | 4/2004 | Fukuda et al. | .............. | 361/93.1 |
| 6,794,836 B1 * | 9/2004 | Strothmann et al. | ......... | 318/268 |
| 6,816,758 B1 * | 11/2004 | Maxwell et al. | ............. | 700/292 |
| 2001/0002782 A1 | 6/2001 | Shimane et al. | ............. | 318/282 |
| 2002/0023242 A1 * | 2/2002 | Kidokoro et al. | .............. | 714/37 |
| 2002/0133305 A1 * | 9/2002 | Chao et al. | .................... | 702/60 |
| 2002/0154519 A1 * | 10/2002 | Nakahara et al. | ............. | 363/20 |
| 2003/0038637 A1 * | 2/2003 | Bertness et al. | ............ | 324/426 |
| 2003/0105562 A1 * | 6/2003 | Hsiao et al. | ................... | 701/22 |
| 2003/0214770 A1 * | 11/2003 | Schimanek et al. | ......... | 361/100 |

FOREIGN PATENT DOCUMENTS

DE         19824064 A1  * 12/1999

(Continued)

*Primary Examiner*—Marc S Hoff
*Assistant Examiner*—Anthony Gutierrez
(74) *Attorney, Agent, or Firm*—Oblon, Spivak, McClelland, Maier & Neustadt, P.C.

(57) ABSTRACT

A switching semiconductor device (11) provided in a semiconductor module (10) includes a plurality of switching semiconductor elements. A loss calculating section (12) calculates a power loss generated in the switching semiconductor device (11) based on a voltage of each of the switching semiconductor elements which is measured by a voltage measuring section (13) and a current of each of the switching semiconductor elements which is measured by a current measuring section (14). The loss calculating section (12) outputs loss data indicative of the power loss thus calculated as a data signal to a motor control section (82) provided on the outside of the semiconductor module (10). The motor control section (82) can recognize the power loss generated in the switching semiconductor device (11) from the loss data.

6 Claims, 19 Drawing Sheets

FOREIGN PATENT DOCUMENTS

| | | |
|---|---|---|
| JP | 58-103881 | 6/1983 |
| JP | 9-233832 | 9/1997 |
| JP | 2000-32608 | 1/2000 |
| JP | 2000050633 A * | 2/2000 |

* cited by examiner

F I G . 5

| OPERATING POINT | ENGINE SPEED (r.p.m) | ENGINE TORQUE (N·m) | TRANSMISSION GEAR RATIO | MOTOR SPEED (r.p.m) | MOTOR TORQUE (N·m) | AIR CONDITIONER COMPRESSOR (r.p.m) | TOTAL OF LOSS |
|---|---|---|---|---|---|---|---|
| 1 | 2000 | 60 | 1.84 | 1000 | 10 | 1000 | |
| LOSS | 10 kW | | 8 kW | | 2 kW | 1 kW | 21 kW |
| 2 | 2400 | 72 | 1.54 | 1200 | 12 | 1200 | |
| LOSS | 5 kW | | 4 kW | | 1 kW | 1.2 kW | 11.2 kW |
| 3 | 1200 | 36 | 3.07 | 600 | 6 | 600 | |
| LOSS | 13 kW | | 6 kW | | 3 kW | 0.6 kW | 22.6 kW |
| 4 | 3000 | 90 | 1.23 | 1500 | 15 | 1500 | OPERATION ON OPERATING POINT 4 |
| LOSS | 4 kW | | 2 kW | | 2 kW | 1.5 kW | 9.5 kW |
| 5 | 2600 | 78 | 1.42 | 1300 | 13 | 1300 | |
| LOSS | 7 kW | | 5 kW | | 1 kW | 2 kW | 15 kW |

| VOLTAGE | CURRENT | LOSS DATA |
|---------|---------|-----------|
| V1 | I1 | D1 |
| V2 | I2 | D2 |
| V3 | I3 | D3 |
| ⋮ | ⋮ | ⋮ |

FIG. 17

| TEMPERATURE | VOLTAGE | CURRENT | LOSS DATA |
|---|---|---|---|
| Temp1 | V1 | I1 | D1 |
|  | V2 | I2 | D2 |
|  | ⋮ | ⋮ | ⋮ |
| Temp2 | V1 | I1 | D11 |
|  | V2 | I2 | D12 |
|  | ⋮ | ⋮ | ⋮ |
| ⋮ | ⋮ | ⋮ | ⋮ |

FIG. 18

| TEMPERATURE | MOTOR TORQUE | LOSS DATA |
|---|---|---|
| Temp1 | T1 | D1 |
|  | T2 | D2 |
|  | ⋮ | ⋮ |
| Temp2 | T1 | D10 |
|  | T2 | D11 |
|  | ⋮ | ⋮ |
| ⋮ | ⋮ | ⋮ |

SEMICONDUCTOR MODULE FOR OUTPUTTING POWER LOSS

BACKGROUND OF THE INVENTION

1. Field of the Invention

The present invention relates to a semiconductor module comprising a switching semiconductor device.

2. Description of the Background Art

In business of automobiles in which an environmental problem has become more serious, nowadays, a hybrid car using an engine and a motor as a driving source together has been developed to enhance a mileage and an exhaust gas characteristic. Moreover, a change of a transmission into a nonstep variable speed gear has been improved to set an operating point of the engine into a place having a better mileage or a smaller exhaust gas.

In such a hybrid car or a vehicle having the nonstep variable speed gear, each operating point of a subsystem to be equipped, for example, an engine system or a transmission system is controlled to implement driving force required for the vehicle, and particularly, to be set into the best place in which energy consumption and an exhaust gas can be reduced.

Above all, in the hybrid car, a semiconductor module comprising a switching semiconductor device provided with a switching semiconductor element for a power such as an IGBT or an MOS transistor (which will be hereinafter referred to as a "switching element") is used for driving a motor at a desirable operating point.

On the other hand, for example, Japanese Patent Application Laid-Open No. 2000-032608 has disclosed a method of expecting a future operation of a car as well as an instantaneous energy efficiency and operating an engine at an operating point having a high energy efficiency in system total in order to cope with a strict mileage regulation in the future. In a method of discriminating the operating point, an engine operating point is changed and the best operating point is stored after trial and error. For this reason, a load related to a whole hybrid system such as a temperature at that time, an electric load state or the like is to be made clear in order to compensate for a selection of the best operating point even if other conditions are assumed to be identical.

If an external environment is varied, for example, an electric load is increased or decreased by driving a subsystem such as an air conditioner, an electric power steering (EPS) or a sliding roof or a power loss characteristic of each subsystem is changed, the best operating point is changed in a similar vehicle operation state. In that case, it is more desirable that an energy efficiency of each subsystem constituting a system should be stored corresponding to an environment which is changed momently and an energy efficiency of the whole system should be decided based thereon than the storage of the energy efficiency in only system total as in the method disclosed in the Japanese Patent Application Laid-Open No. 2000-032608. In other words, it is desirable to employ a method of storing the power loss of each subsystem constituting the system corresponding to the environment which is changed momently and deciding the power loss of the whole system based thereon.

On the other hand, as described above, the semiconductor module comprising the switching semiconductor device is used for controlling a motor of a motor system or a subsystem such as a sliding roof in a hybrid car. In order to obtain a power loss of a subsystem comprising the semiconductor module by employing the method described above, it is necessary to cause an external system of the semiconductor module to recognize a value of a power loss of the switching semiconductor device used therein.

SUMMARY OF THE INVENTION

It is an object of the present invention to provide a technique for causing an external system to recognize a power loss of a switching semiconductor device in a semiconductor module comprising the switching semiconductor device.

According to the present invention, a semiconductor module includes a switching semiconductor device, and outputs loss data indicative of a power loss generated in the switching semiconductor device as a data signal to an outside.

An external system can recognize a loss generated in the switching semiconductor device. In a system including the semiconductor module according to the present invention, accordingly, it is possible to work out a control strategy having the highest energy efficiency in the whole system based on the loss data obtained from the semiconductor module and a value of a loss obtained from another subsystem.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a table showing a candidate for an operating point determined by the system employing the semiconductor module, FIGS. 17 and 18 are tables showing an example of data to be stored in a storage section of the semiconductor module.

DESCRIPTION OF THE PREFERRED EMBODIMENTS

First Embodiment

Figure 1:
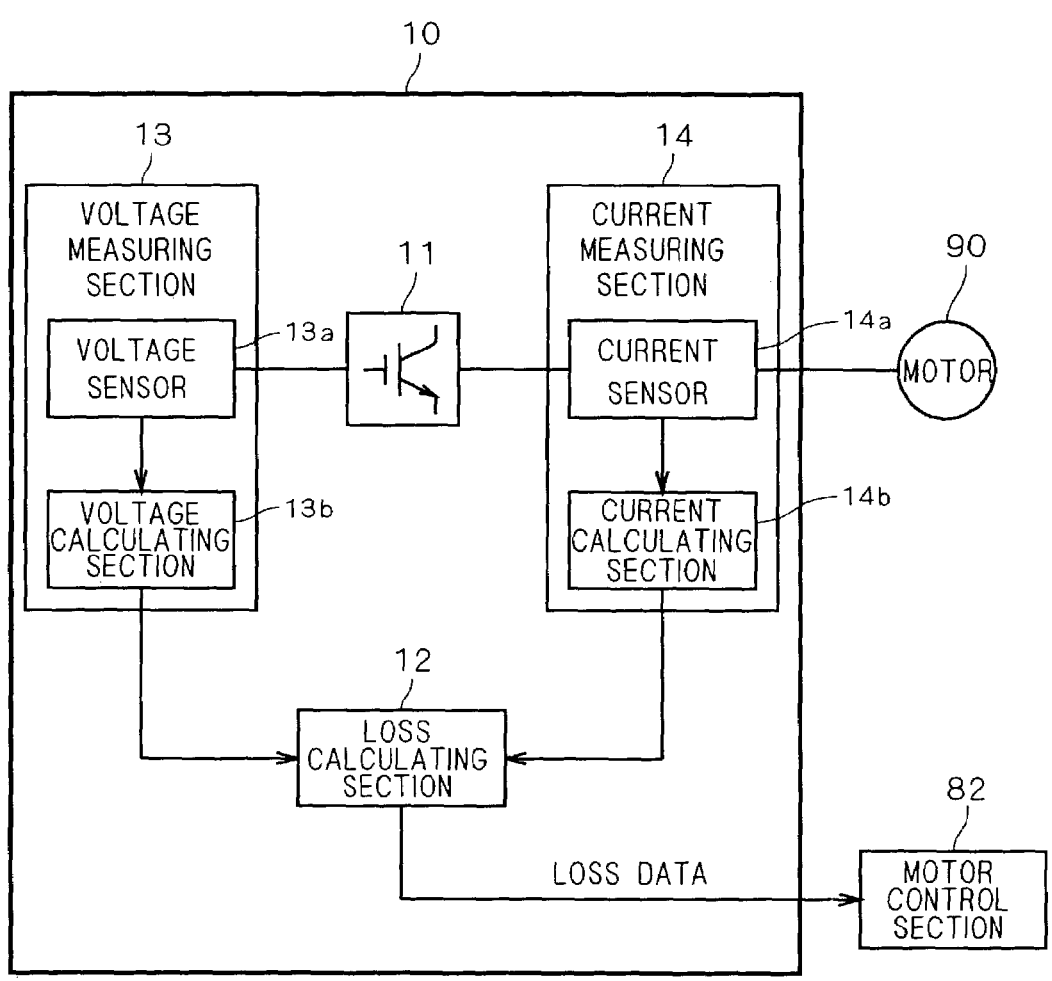
FIG. 1 is a block diagram showing a structure of a semiconductor module according to a first embodiment of the present invention.
Figure 2:
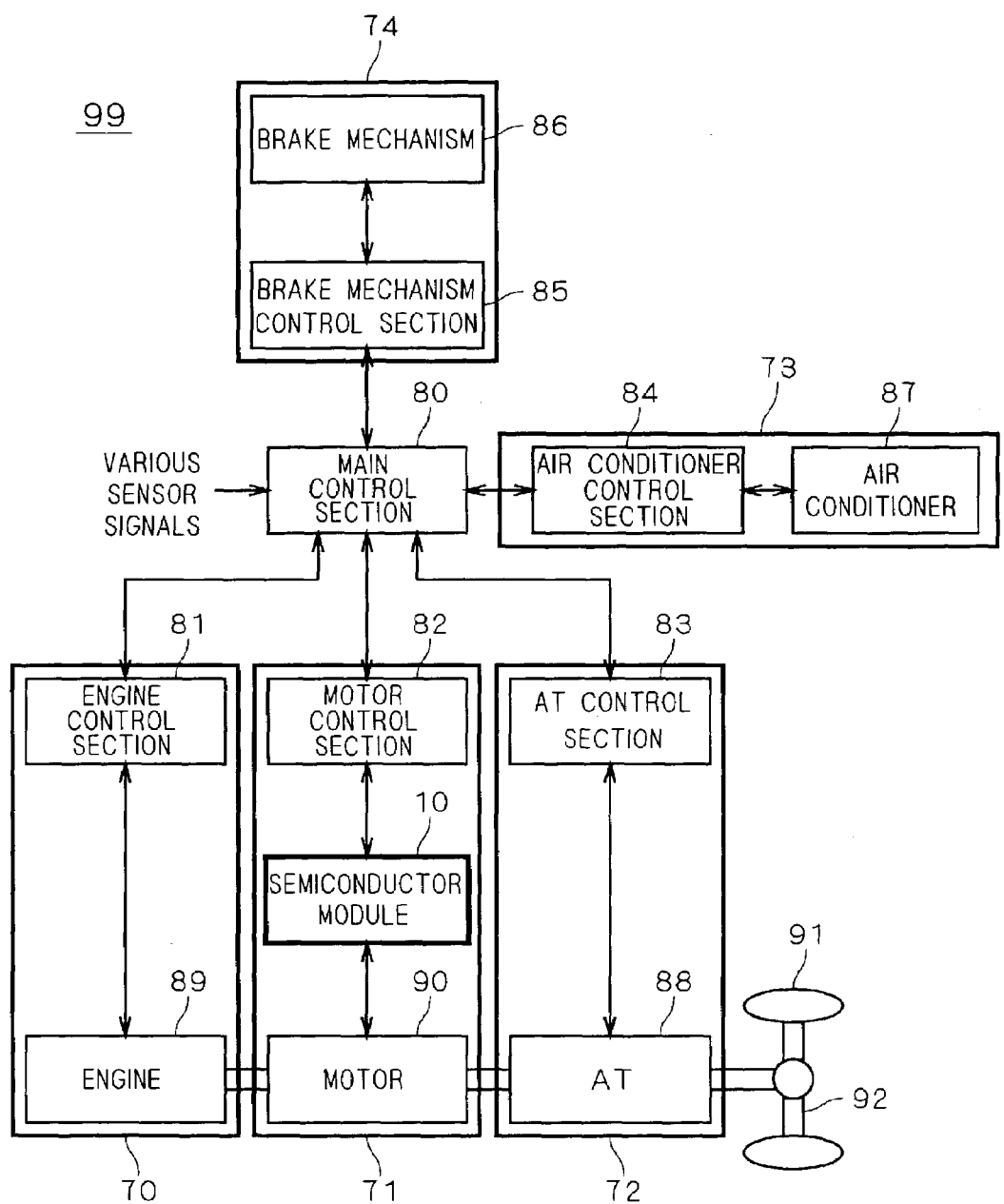
FIG. 2 is a block diagram showing a structure of a system for which the semiconductor module is employed.

FIG. 1 is a block diagram showing a structure of a semiconductor module 10 according to a first embodiment of the present invention, and FIG. 2 is a block diagram showing a structure according to an example of a system 99 using the semiconductor module 10 illustrated in FIG. 1. The system 99 shown in FIG. 2 is a hybrid car system and is constituted by a main control section 80 for unifying an operation of the whole system, an engine system 70, a motor system 71, an automatic transmission (hereinafter referred to as an "AT") system 72, an air conditioner system 73 and a brake system 74, for example.

Various sensor signals such as an output of an accelerator sensor which is not shown are inputted to the main control section 80. The main control section 80 determines an operating point of the whole system.

The engine system 70 includes an engine 89 and an engine control section 81. The engine control section 81 controls an operation of the engine 89, and furthermore, obtains a power loss in the engine 89.

The AT system 72 includes an AT 88 and an AT control section 83. The AT control section 83 controls an operation of the AT 88, and furthermore, obtains a power loss in the AT 88.

The air conditioner system 73 includes an air conditioner 87 and an air conditioner control section 84. The air conditioner control section 84 controls an operation of the air conditioner 87, and furthermore, obtains a power loss in the air conditioner 87.

The brake system 74 includes a brake mechanism 86 and a brake mechanism control section 85. The brake mechanism control section 85 controls an operation of the brake mechanism 86, and furthermore, obtains a power loss in the brake mechanism 86.

The motor system 71 includes a motor 90, the semiconductor module 10 for controlling an operation of the motor 90, and a motor control section 82 for controlling an operation of the semiconductor module 10. In some cases, the "power loss" will be hereinafter referred to as a "loss".

A driving wheel 91 is attached to a driving shaft 92. A torque is given to the driving shaft 92 by the engine 89, the motor 90 and the AT 88 so that the driving wheel 91 is rotated.

Next, the semiconductor module 10 according to the present invention will be described. As shown in FIG. 1, the semiconductor module 10 according to the first embodiment comprises a switching semiconductor device 11 which serves to control an operation of the motor 90 and is provided with a plurality of switching elements, a loss calculating section 12 for calculating a loss in the switching semiconductor device 11, a voltage measuring section 13 and a current measuring section 14, and these components are accommodated in one package.

Figure 3:
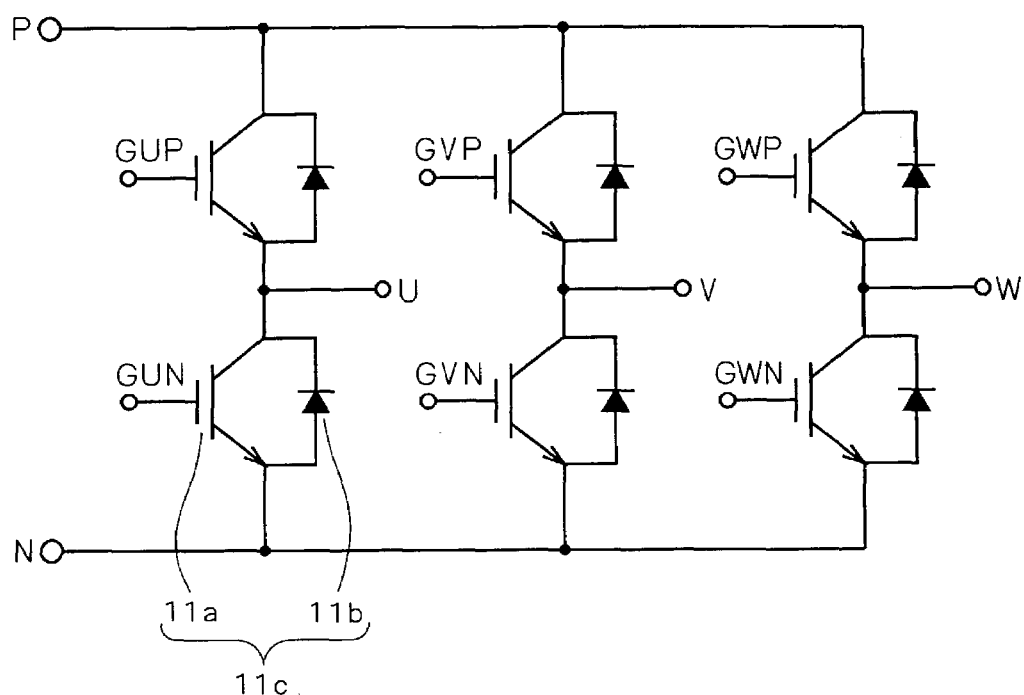
FIG. 3 is a circuit diagram showing a structure of a switching semiconductor device.

FIG. 3 is a circuit diagram showing an example of a structure of the switching semiconductor device 11 in the case in which a three phase AC motor is employed for the motor 90 and an IGBT is employed for the switching element, for example. As shown in FIG. 3, the switching semiconductor device 11 is constituted by a three phase inverter circuit, for example. More specifically, semiconductor elements 11c constituted by IGBTs 11a and diodes 11b connected thereto in antiparallel are connected to each other in series, which will be referred to as an arm. The switching semiconductor device 11 includes three arms connected in parallel.

Output terminals U, V and W are connected to the motor 90 and a predetermined voltage is applied from a power circuit provided in the motor control section 82 shown in FIG. 2 to input terminals P and N. Each of control terminals GUP, GUN, GVP, GVN, GWP and GWN is controlled by the motor control section 82 so that each of the IGBTs 11a is turned ON/OFF. Consequently, a rotating operation of the motor 90 is controlled. In some cases, the control terminals GUP, GUN, GVP, GVN, GWP and GWN will be collectively referred to as a "control terminal CONT".

The voltage measuring section 13 has a voltage sensor 13a for detecting a voltage applied between an emitter and a collector of the IGBT 11a shown in FIG. 3, and a voltage calculating section 13b for calculating a voltage between the emitter and the collector in the IGBT 11a based on a result of the detection. The voltage sensor 13a is provided between the input terminal P and each of the output terminals U, V and W, for example, and furthermore, is provided between the input terminal N and each of the output terminals U, V and W. The voltage calculating section 13b filters and amplifies an output of each voltage sensor 13a to calculate a voltage of each IGBT 11a, and furthermore, carries out an A/D conversion and outputs the calculated voltage as digital data to the loss calculating section 12.

Moreover, the current measuring section 14 has a current sensor 14a for detecting a current flowing between the emitter and the collector in the IGBT 11a, and a current calculating section 14b for calculating a current between the emitter and the collector in the IGBT 11a based on a result of the detection. The current sensor 14a is provided between each of the output terminals U, V and W and the motor 90, for example. The current measuring section 14 filters and amplifies an output of each current sensor 14a to obtain a current of the IGBT 11a, and furthermore, carries out an A/D conversion and outputs the obtained current as digital data to the loss calculating section 12.

In the case in which an MOS transistor is employed in place of the IGBT 11a, a voltage between a source and a drain in the MOS transistor is measured in the voltage measuring section 13 and a current between the source and the drain is measured in the current measuring section 14.

The loss calculating section 12 calculates a loss generated in each IGBT 11a in the same timing based on the voltage measured by the voltage measuring section 13 and the current measured by the current measuring section 14. The loss of each IGBT 11a thus calculated is summed up to obtain a loss in the whole switching semiconductor device 11 in the timing. A method of calculating the loss of the switching semiconductor device 11 will be described below in detail.

First of all, a voltage waveform and a current waveform are obtained for each IGBT 11a from the voltage and the current which are measured as shown in FIGS. 4A to 4F, in which a horizontal axis indicates an operating time of the IGBT 11a and a longitudinal axis indicates a voltage and a current of the IGBT 11a. FIGS. 4A to 4F show a waveform of the IGBT 11a connected to the terminal GUP, a waveform of the IGBT 11a connected to the terminal GVP, a waveform of the IGBT 11a connected to the terminal GWP, a waveform of the IGBT 11a connected to the terminal GUN, a waveform of the IGBT 11a connected to the terminal GVN and a waveform of the IGBT 11a connected to the terminal GWN sequentially from a top of the paper. Moreover, the voltage of the IGBT 11a is shown in a one-dotted chain line and the current of the IGBT 11a is shown in a solid line.

Every time any of the IGBTs 11a carries out a switching operation, a power consumed by the switching operation in each IGBT 11a at that time is obtained. More specifically, an area 60 shown in each of FIGS. 4A to 4F represents a power consumed in the switching operation of the IGBT 11a. The area 60 is obtained in each IGBT 11a from the voltage waveform and the current waveform which are acquired. Consequently, a loss in each IGBT 11a in the switching operation can be obtained.

Figure 4:
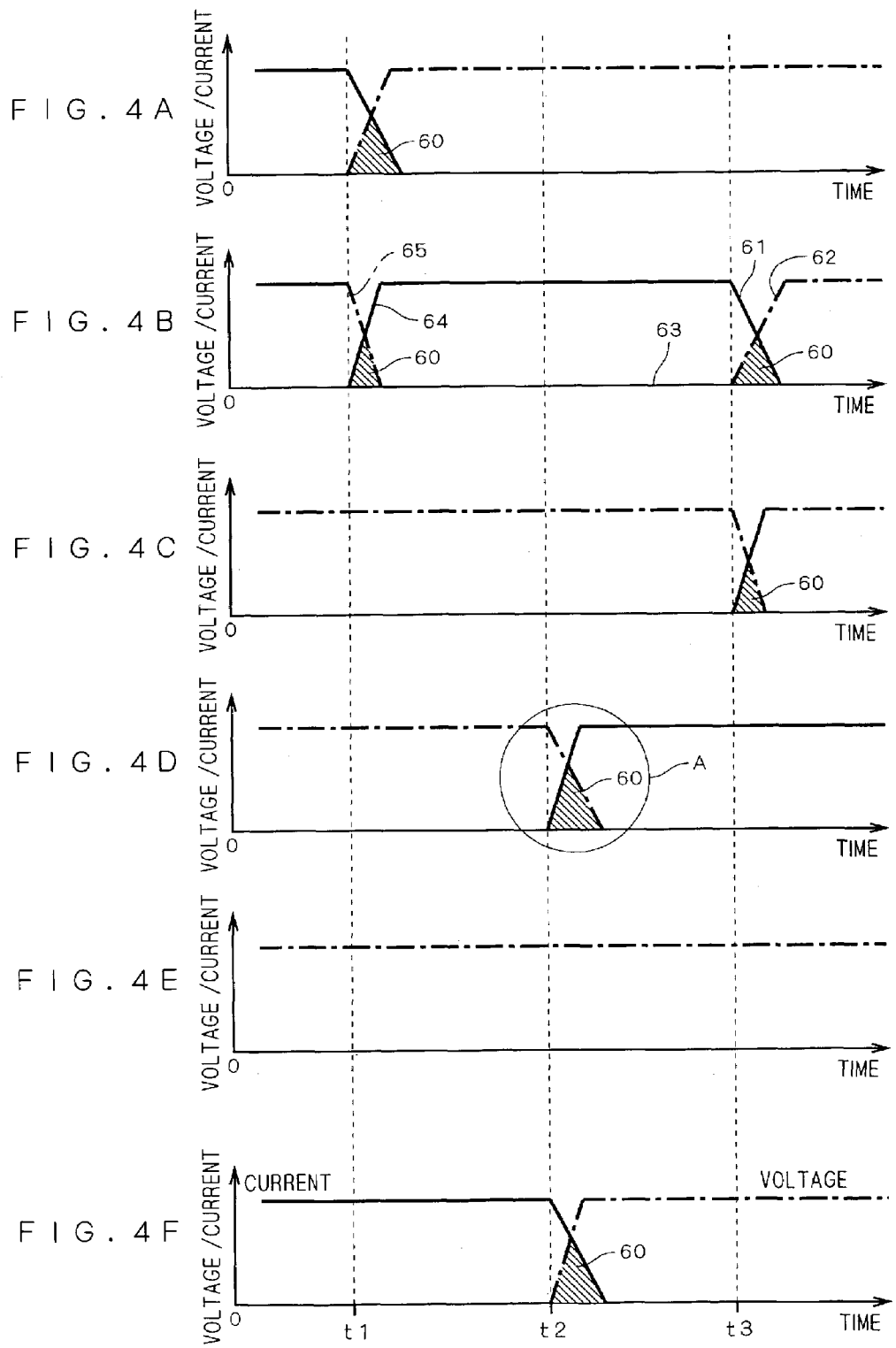
FIGS. 4A to 4F are charts showing a relationship between a voltage and a current of an IGBT and an operating time.

In a timing immediately after a time t1 shown in FIGS. 4A to 4F, for example, the IGBT 11a connected to the terminal GUP and the IGBT 11a connected to the terminal GVP carry out the switching operation and other IGBTs 11a do not carry out the switching operation. Therefore, the areas 60 shown in FIGS. 4A and 4B are obtained, respectively. In a timing immediately after a time t2, moreover, the IGBT 11a connected to the terminal GUN and the IGBT 11a connected to the terminal GWN carry out the switching operation and the other IGBTs 11a do not carry out the switching operation. Therefore, the areas 60 shown in FIGS. 4D and 4F are obtained, respectively. The area 60 shown in each of FIGS. 4A to 4F is enclosed by a line 61 indicative of a fall of the current waveform, a line 62 indicative of a rise of the voltage waveform and a straight line 63 extended in the direction of a time base of the horizontal axis, indicating a voltage and a current of zero or is enclosed by a line 64 indicative of a rise of the current waveform, a line 65 indicative of a fall of the voltage waveform and the straight line 63.

The loss calculating section 12 sums up the loss of each IGBT 11a which is obtained and calculates a power consumed by the switching semiconductor device 11 in the timing. Consequently, a loss of the whole switching semiconductor device 11 is obtained as digital data.

Next, the loss calculating section 12 converts the data indicative of the loss generated in the switching semiconductor device 11 (which will be hereinafter referred to as "loss data") thus obtained based on a value represented by LSB of data which can be processed by the motor control section 82 if necessary, and outputs the loss data as a data signal to an external system, that is, the motor control section 82 shown in FIG. 2 according to the first embodiment every time any of the IGBTs 11a carries out the switching operation. The "system" in this specification implies each of components such as the main control section 80 and the motor control section 82 which constitute the whole system in addition to the whole system.

In the case in which a value represented by the LSB of the loss data thus obtained is smaller than the value represented by the LSB of the data which can be processed by the motor control section 82, the loss data thus obtained are to be converted into the data which can be processed by the motor control section 82.

For example, in the case in which the value represented by the LSB of the loss data thus obtained is $1/2^{12}$ kW and the loss data are "110011010" in a binary notation, the value of a loss represented by the loss data is approximately 0.1 kW. When the value represented by the LSB of the data which can be processed by the motor control section 82 is $1/2^{10}$ kW, the loss calculating section 12 converts the loss data from "110011010" to "01100110" in the binary notation based on the value represented by the LSB. Consequently, the loss data are converted into the data which can be processed by the motor control section 82.

Thus, the loss calculating section 12 converts the obtained loss data if necessary and outputs the loss data as a data signal to the motor control section 82 provided on the outside of the semiconductor module 10. Then, the motor control section 82 receives the data signal and stores the loss data of the data signal.

Next, an operation of the motor control section 82 will be described. The motor control section 82 determines a voltage to be applied to the switching semiconductor device 11 in the semiconductor module 10 and a current to flow thereto in order to operate the motor 90 on an operating point determined by the main control section 80 by a method which will be described below. More specifically, a voltage to be applied to the input terminals P and N of the switching semiconductor device 11 and a current to flow into the output terminals U, V and W are determined in order to operate the motor 90 at a speed and a torque which are determined by the main control section 80. The voltage and the current of the switching semiconductor device 11 which are thus determined by the motor control section 82 will be referred to as a "set voltage" and a "set current", respectively.

Then, the motor control section 82 supplies a predetermined voltage from a built-in power circuit (not shown) to the input terminals P and N of the switching semiconductor device 11 based on the set voltage and the set current which are determined, and causes each IGBT 11a to carry out the switching operation in a predetermined timing. Consequently, a predetermined torque and a predetermined speed are generated in the motor 90. In the case in which the motor 90 is to be operated on the same operating point, almost the same current flows into each of the output terminals U, V and W.

The motor control section 82 receives the loss data from the semiconductor module 10 and then stores the loss data corresponding to the set voltage and the set current at that time. Thereafter, the main control section 80 changes the operating point of the motor 90. Consequently, when the set voltage or the set current is changed, the loss data received after the change are stored newly corresponding to the set voltage and the set current. Thus, the loss data corresponding to various set voltages and set currents are stored in the motor control section 82.

Next, description will be given to a method of determining an operating point of the whole system 99 shown in FIG. 2 which comprises the semiconductor module 10 serving to output the loss data to the outside as described above.

The main control section 80 recognizes an accelerator opening from a sensor signal sent from an accelerator sensor which is not shown, and calculates a torque (hereinafter referred to as a "driving shaft torque") to be generated in the driving shaft 92 based thereon.

Then, the main control section 80 determines a plurality of candidates for the operating point of the whole system based on the driving shaft torque thus obtained. More specifically, the main control section 80 determines a plurality of combinations of an operating point of the engine 89 which is defined by a toque and revolutions per minute, an operating point of the motor 90 which is defined by a torque and revolutions per minute and a gear ratio of the AT 88, for example. At this time, if an air conditioner is used, the candidate for the operating point is determined in consideration of the revolutions per minute in a compressor of the air conditioner.

FIG. 5 shows an example of the candidate for the operating point of the system which is determined by the main control section 80. FIG. 5 shows operating points 1 to 4 as the candidate for the operating point of the system. In FIG. 5, the candidate is proposed for the operating point in such a state that a brake does not work, that is, the brake mechanism 86 is not operated.

The main control section 80 determines an operating point having the smallest loss for the whole system from the candidates of the operating point which are determined. Description will be given to an operation of the system 99 for determining the operating point having the smallest loss from the operating points 1 to 4 shown in FIG. 5.

First of all, the main control section 80 demands to output, to the engine control section 81, a loss in the engine 89 in the case in which the engine 89 is operated at an engine speed (2000 r.p.m) and an engine torque (60 N·m) on the operating point 1. The engine control section 81 stores a value of the loss in the engine 89 on various operating points and outputs, to the main control section 80, a value of a loss corresponding to the engine speed and the engine torque on the operating point 1.

The main control section 80 stores the value of the loss thus received corresponding to the engine speed and the engine torque on the operating point 1. In the first embodiment, the value of the loss is 10 kW, for example, as shown in FIG. 5.

Next, the main control section 80 demands to output, to the AT control section 83, a loss in the AT 88 in the case in which the AT 88 is operated at a gear ratio (1.84) on the operating point 1. The AT control section 83 stores a value of the loss in the AT 88 on various operating points and outputs, to the main control section 80, a value of a loss corresponding to the gear ratio on the operating point 1.

The main control section 80 stores the value of the loss thus received corresponding to the gear ratio of the AT 88 on the operating point 1. In the first embodiment, the value of the loss is 8 kW, for example, as shown in FIG. 5.

Subsequently, the main control section 80 demands to output, to the motor control section 82, a loss in the switching semiconductor device 11 of the semiconductor module 10 in the case in which the motor 90 is operated at a motor speed (1000 r.p.m) and a motor torque (10N·m) on the operating point 1. In the first embodiment, a loss is not generated in the motor 90 itself.

The motor control section 82 obtains a set voltage and a set current of the switching semiconductor device 11 in the semiconductor module 10 based on the motor speed and the motor torque on the operating point 1. Then, the motor control section 82 outputs, to the main control section 80, loss data corresponding to the set voltage and the set current which are thus obtained. Consequently, the main control section 80 receives a value of a loss of the semiconductor module 10 on the operating point 1. In the first embodiment, the value of the loss is 2 kW, for example, as shown in FIG. 5.

Next, the main control section 80 demands to output, to the air conditioner control section 84, a loss in the air conditioner 87 in the case in which the compressor of the air conditioner 87 is operated at revolutions per minute (1000 r.p.m) on the operating point 1. The air conditioner control section 84 stores a value of the loss in the air conditioner 87 at various revolutions per minute of the compressor and outputs, to the main control section 80, a value of a loss corresponding to the revolutions per minute on the operating point 1.

The main control section 80 stores the value of the loss thus received corresponding to the revolutions per minute of the compression on the operating point 1. In the first embodiment, the value of the loss is 1 kW, for example, as shown in FIG. 5.

The main control section 80 sums up the value of the loss in each subsystem which is obtained as described above, thereby acquiring a value of a loss of the whole system on the operating point 1. In the first embodiment, as shown in FIG. 5, the value of the loss of the whole system is 21 kW. The main control section 80 calculates a value of a loss of the system on each of operating points 2, 3 and 4 in the same manner. In the first embodiment, values of 11.2 kW, 22.6 kW, 9.5 kW and 15 kW are obtained as shown in FIG. 5, respectively.

The main control section 80 calculates the value of the loss on each of the operating points 1 to 4 and determines, as the operating point of the system 99, any of the operating points which has the smallest value. In the first embodiment, the value of the loss on the operating point 4 is 9.5 kW, which is the smallest in the candidates. Therefore, the system 99 is determined to be operated on the operating point 4. Consequently, it is possible to work out a control strategy having the highest energy efficiency in the whole system.

The main control section 80 determines the operating point and then operates each subsystem based thereon. More specifically, the main control section 80 notifies the engine control section 81 of the operating point of the engine (the engine speed and the engine torque) on the operating point 4, and the engine control section 81 operates the engine 89 on that operating point. Moreover, the main control section 80 notifies the motor control section 82 of the operating point of the motor (the motor speed and the motor torque) on the operating point 4, and the motor control section 82 operates the motor 90 on that operating point. Furthermore, the main control section 80 notifies the AT control section 83 of a gear ratio of the AT 88 on the operating point 4 and the AT control section 83 operates the AT 88 at the gear ratio. Then, the main control section 80 notifies the air conditioner control section 84 of revolutions per minute of the compressor of the air conditioner 87 on the operating point 4 and the air conditioner control section 84 operates the compressor at the revolutions per minute.

As described above, in the semiconductor module 10 according to the first embodiment, the loss data indicative of the loss generated in the switching semiconductor device 11 are output to the outside. Therefore, the motor control section 82 to be a system positioned on the outside of the semiconductor module 10 can recognize the loss in the switching semiconductor device 11. As in the system 99 according to the first embodiment, accordingly, it is possible to work out a control strategy having the highest energy efficiency in the whole system based on the loss data obtained from the semiconductor module 10 and the values of the losses obtained from the other subsystems in the system comprising the semiconductor module 10.

In the semiconductor module 10 according to the first embodiment, moreover, the voltage and the current of the IGBT 11*a* are measured inside the semiconductor module 10. Differently from the semiconductor module 10 according to the first embodiment, in some cases in which the voltage measuring section 13 and the current measuring section 14 are present on the outside of the semiconductor module 10, it is impossible to accurately measure the voltage and the current of the IGBT 11*a* by the influence of an impedance of a connecting terminal for carrying out a connection to the outside which is provided in a package of the semiconductor module 10 or the like.

However, the voltage measuring section 13 and the current measuring section 14 are provided inside the semiconductor module 10 according to the first embodiment. Therefore, it is possible to accurately measure the voltage and the current of the IGBT 11*a* without the influence described above. As a result, it is possible to provide loss data having high precision to the external system. Furthermore, the semiconductor module 10 is modularized. Also in the case in which a failure is generated in the switching semiconductor device 11, therefore, an exchange can easily be carried out.

While the areas 60 shown in FIGS. 4A to 4F are obtained as a specific method of acquiring the loss of the IGBT 11*a* in the first embodiment, the loss may be obtained by another method. For example, the loss calculating section 12 calculates a rise time t1 of a current and a fall time t2 of a voltage in an ON operation of the IGBT 11*a* shown in FIG. 6 from the voltage waveform and the current waveform which are obtained. The rise time t1 of the current is taken for a change in a current flowing between an emitter and a collector of the IGBT 11*a* from 10% of a maximum value to 90% thereof, for example. Moreover, the fall time t2 of the voltage is taken for a change in a voltage applied between the emitter and the collector of the IGBT 11*a* from 90% of a maximum value to 10% thereof, for example.

Figure 6:
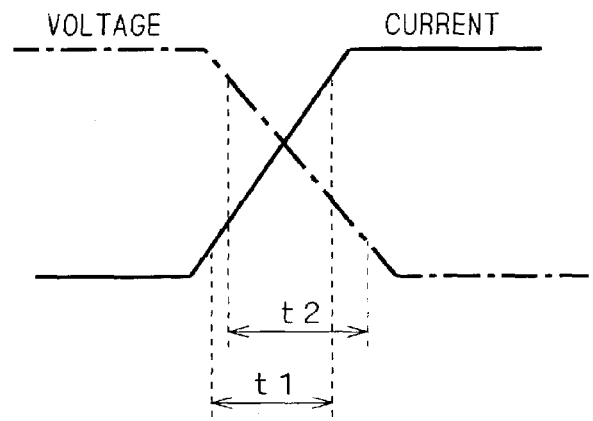
FIG. 6 is an enlarged diagram showing a portion A in FIG. 4D.

A loss generated in the ON operation of the IGBT 11*a* is almost determined by the rise time t1 of the current and the fall time t2 of the voltage. Accordingly, a plurality of sets of the rise time t1 of the current and the fall time t2 of the voltage are supposed and a value of a loss corresponding to each set is prestored in the loss calculating section 12. Consequently, it is possible to obtain a loss generated in an ON operation of the IGBT 11*a* from the rise time t1 of the current and the fall time t2 of the voltage which are acquired. FIG. 6 is an enlarged diagram showing a portion A in FIG. 4D, in which the area 60 is not shown.

Similarly, the loss calculating section 12 calculates a fall time of a current and a rise time of a voltage in the OFF operation of the IGBT 11*a* from the voltage waveform and the current waveform which are obtained. The fall time of the current is taken for a change in the current flowing between the emitter and the collector of the IGBT 11*a* from 90% of the maximum value to 10% thereof, for example. Moreover, the rise time of the voltage is taken for a change in the voltage applied between the emitter and the collector of the IGBT 11*a* from 10% of the maximum value to 90% thereof, for example.

A loss generated in the OFF operation of the IGBT 11*a* is almost determined by the fall time of the current and the rise time of the voltage. Accordingly, a plurality of sets of the fall time of the current and the rise time of the voltage are supposed and a value of a loss corresponding to each set is prestored in the loss calculating section 12. Consequently, it is possible to obtain a loss generated in the OFF operation of the IGBT 11*a* from the fall time of the current and the rise time of the voltage which are acquired.

It is also possible to obtain the loss of the whole switching semiconductor device 11 as described above based on the losses in the ON and OFF operations of the IGBT 11*a* thus acquired.

Second Embodiment

Figure 7:
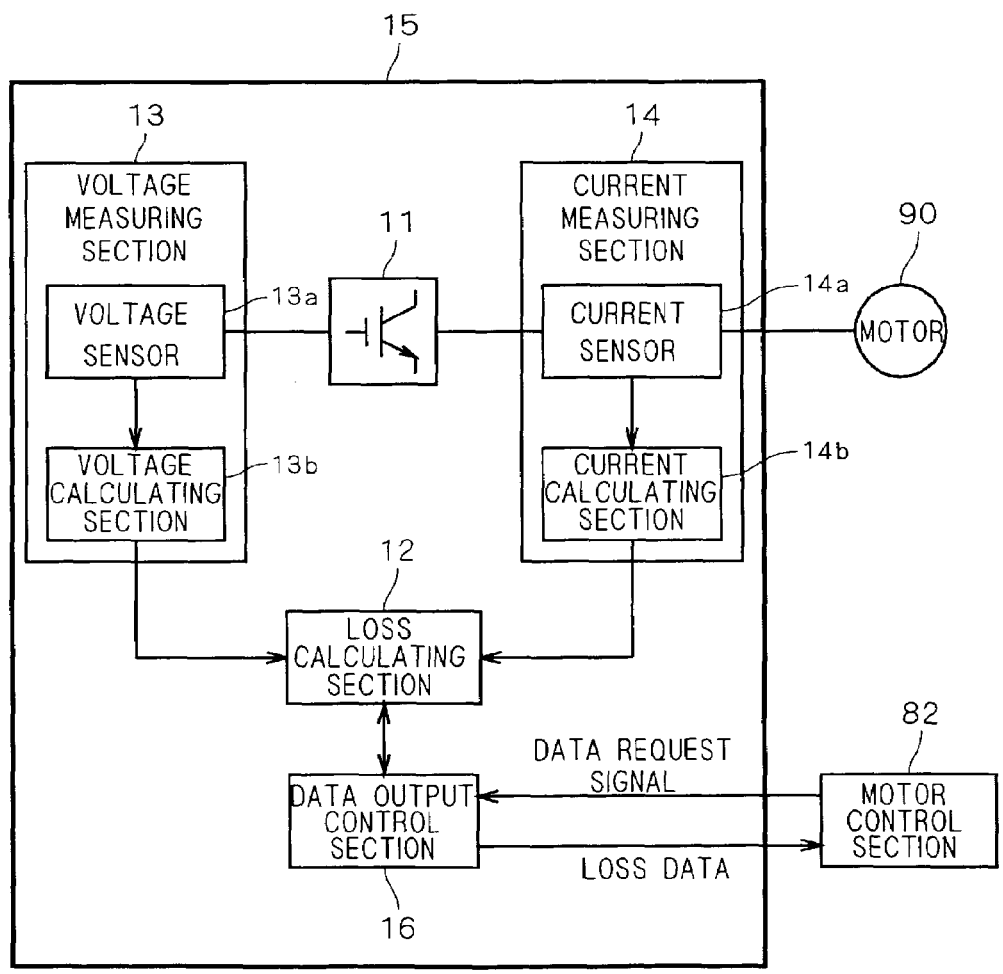
FIG. 7 is a block diagram showing a structure of a semiconductor module according to a second embodiment of the present invention.

FIG. 7 is a block diagram showing a structure of a semiconductor module 15 according to a second embodiment. The semiconductor module 15 according to the second embodiment further comprises a data output control section 16 internally in the semiconductor module 10 according to the first embodiment described above, and serves to output loss data obtained by a loss calculating section 12 to the outside through the data output control section 16. In the second embodiment, the semiconductor module 15 shown in FIG. 7 is employed in place of the semiconductor module 10 in the system 99 described above.

The data output control section 16 includes a buffer which is not shown, and serves to write the loss data output from the loss calculating section 12 to the buffer. Every time the loss data are received from the loss calculating section 12, the loss data in the buffer are updated. Moreover, the data output control section 16 communicates with a motor control section 82 provided on the outside of the semiconductor module 15, thereby controlling the output of the loss data in the buffer to the outside. Since other structures are the same as those of the semiconductor module 10 according to the first embodiment, description thereof will be omitted.

Figure 8:
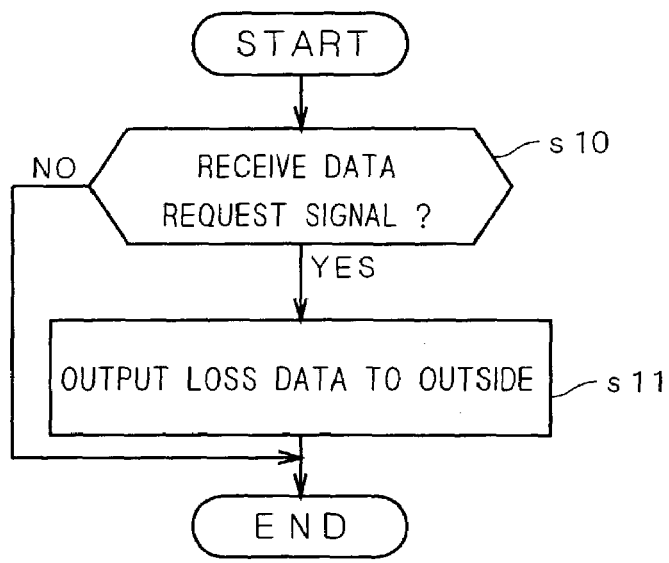
FIG. 8 is a flow chart showing a data output method of the semiconductor module according to the second embodiment of the present invention.

FIG. 8 is a flow chart showing a data output method of the semiconductor module 15, more specifically, a flow chart showing an operation of the semiconductor module 15 to be carried out for outputting the loss data to the outside. The operation of the semiconductor module 15 to be carried out for outputting the loss data to the outside will be described below with reference to FIG. 8.

As shown in FIG. 8, when the data output control section 16 receives a data request signal indicative of an output request for loss data from the motor control section 82 at a step s10, it outputs the loss data written in the built-in buffer in the motor control section 82 at a step s11.

In the semiconductor module 15 according to the second embodiment, thus, the loss data are output in response to a request of the motor control section 82 to be an external system.

In the first embodiment, the loss data are output to the motor control section 82 in the timing determined on the semiconductor module 10 side irrespective of the operating situation of the motor control section 82. Therefore, the loss data are inputted to the motor control section 82 irrespective of the operating situation thereof. In the case in which the semiconductor module 10 frequently outputs the loss data, consequently, a communication line between the semiconductor module 10 and the motor control section 82 is overloaded.

In the first embodiment, when the operating point of the motor is not changed for a long time, the motor control section 82 frequently receives the loss data on the same operating point from the semiconductor module 10 through it has already stored the loss data on the same operating point. For this reason, it is necessary to process unnecessary loss data and a time is taken for a useless processing in some cases.

In the semiconductor module 15 according to the second embodiment, the loss data are output to the outside in response to the request of the motor control section 82. Therefore, the motor control section 82 can receive the loss data from the semiconductor module 15 according to its own operating situation. Consequently, the motor control section 82 can communicate with the semiconductor module 15 at a proper communication load. Furthermore, it is not necessary to process the unnecessary loss data. Thus, the useless processing can be reduced.

Third Embodiment

Figure 9:
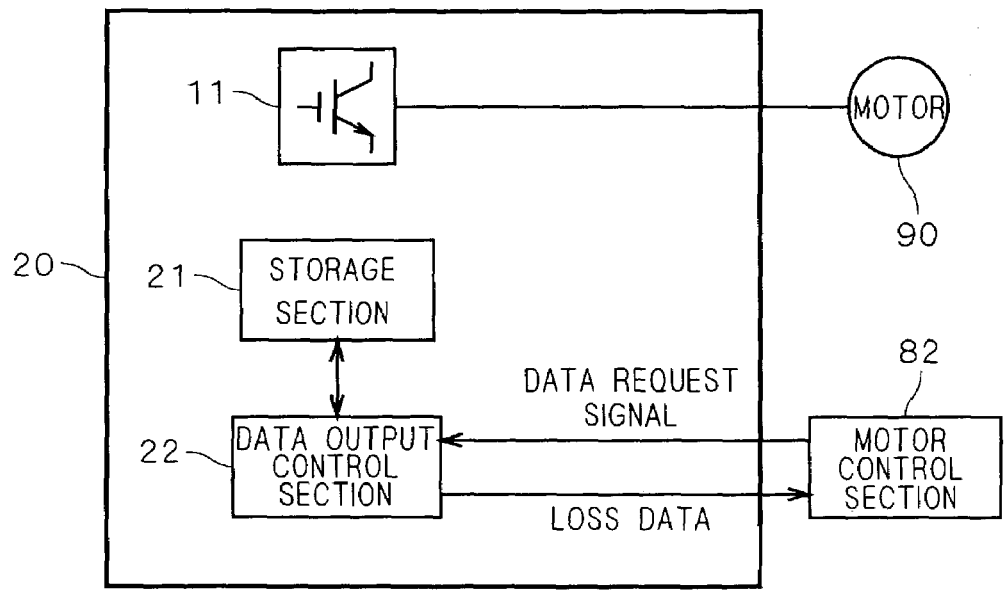
FIG. 9 is a block diagram showing a structure of a semiconductor module according to a third embodiment of the present invention.

FIG. 9 is a block diagram showing a structure of a semiconductor module 20 according to a third embodiment. As shown in FIG. 9, the semiconductor module 20 according to the third embodiment comprises the switching semiconductor device 11 provided in the semiconductor module 10 according to the first embodiment, a storage section 21 for storing loss data, and a data output control section 22 for communicating with a motor control section 82 and controlling an output of the loss data to the outside. These components are accommodated in one package. In the third embodiment, the semiconductor module 20 shown in FIG. 9 is employed in place of the semiconductor module 10 in the system 99 described above.

The storage section 21 is constituted by an RAM (random access memory), for example, and prestores a characteristic value of the switching semiconductor device 11 such as a voltage to be applied to the switching semiconductor device 11, a current to flow thereto or the like and loss data corresponding to each other. Such data are stored in the storage section 21 at a pre-shipment inspecting step in a process for manufacturing the semiconductor module 20, for example. In some cases, data prestored in the storage section such as the loss data and the characteristic value of the switching semiconductor device 11 will be hereinafter referred to as "initial data".

Figures 10, 11:
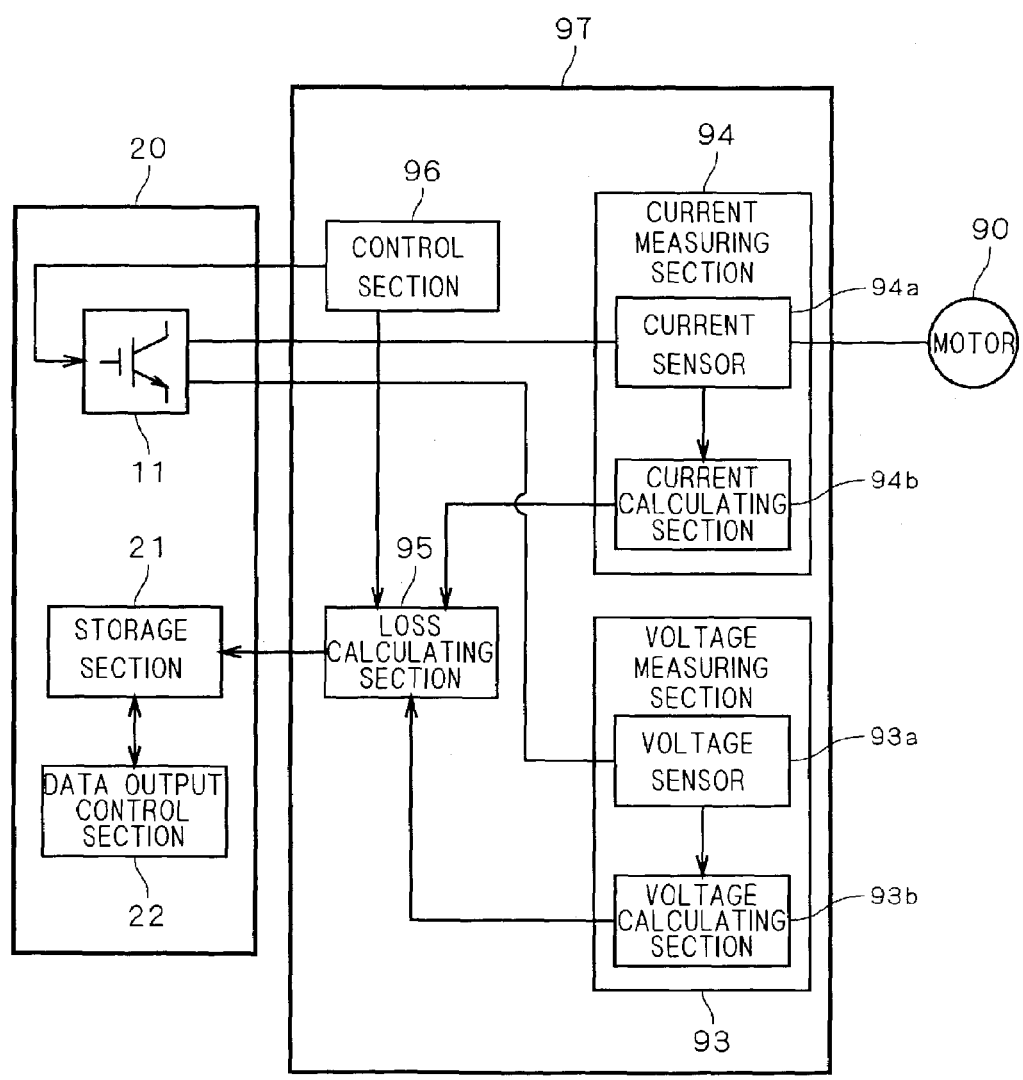
FIG. 10 is a table showing an example of data to be stored in a storage section of the semiconductor module.
FIG. 11 is a block diagram showing a structure of a testing device for storing initial data in the storage section of the semiconductor module.

FIG. 10 is a table showing an example of the initial data stored in the storage section 21. As shown in FIG. 10, the storage section 21 stores a table constituted by the loss data and the characteristic values such as the voltage, the current and the like in the switching semiconductor device with which a loss indicated by the loss data is generated.

Voltages V1 to V3 in FIG. 10 represent a part of the voltages of the switching semiconductor device 11 which are stored in the storage section 21 and are to be applied to input terminals P and N of the switching semiconductor device 11. Moreover, currents I1 to I3 represent a part of the currents of the switching semiconductor device 11 which are stored in the storage section 21 and are to flow into output terminals U, V and W of the switching semiconductor device 11. The voltage V1 and the current I1 represent the voltage and the current of the switching semiconductor device 11 with which a loss indicated by loss data D1 is generated. The voltage V1, the current I1 and the loss data D1 are stored in the storage section 21 corresponding to each other. Similarly, the voltage V2 and the current I2 represent the voltage and the current of the switching semiconductor device 11 with which a loss indicated by loss data D2 is generated, and the voltage V3 and the current I3 represent the voltage and the current of the switching semiconductor device 11 with which a loss indicated by loss data D3 is generated. The voltage V2, the current I2 and the loss data D2 are stored in the storage section 21 corresponding to each other, and the voltage V3, the current I3 and the loss data D3 are stored in the storage section 21 corresponding to each other.

FIG. 11 is a block diagram showing a structure of a testing device 97 to be used for storing the initial data in the storage section 21. At the pre-shipment inspecting step of the semiconductor module 20, the testing device 97 shown in FIG. 11 is prepared for writing the initial data to the storage section 21.

The testing device 97 comprises a loss calculating section 95, a voltage measuring section 93 having a voltage sensor 93a and a voltage calculating section 93b, a current measuring section 94 having a current sensor 94a and a current calculating section 94b, and a control section 96. In order to store the initial data in the storage section 21, the loss calculating section 95 is connected to the storage section 21 of the semiconductor module 20, and the voltage measuring section 93, the current measuring section 94 and the control section 96 are connected to the switching semiconductor device 11. Then, a motor 90 is connected to the switching semiconductor device 11 through the current sensor 94a of the current measuring section 94. By taking the initial data shown in FIG. 10 as an example, a procedure for writing the initial data to the storage section 21 by using the testing device 97 will be described below. Since a method of obtaining the loss data is the same as described in the first embodiment, repetitive portions of the contents described above will be described briefly.

First of all, the control section 96 applies the voltage V1 to the input terminals P and N of the switching semiconductor device 11. Then, the control section 96 applies a predetermined voltage to a control terminal CONT to control a switching operation of each IGBT 11a of the switching semiconductor device 11, and causes the current I1 to flow to the output terminals U, V and W. Subsequently, the control section 96 notifies the loss calculating section 95 of information about the voltage V1 and the current I1 set at this time.

Next, the current measuring section 94 measures a current flowing between an emitter and a collector of each IGBT 11a in the switching semiconductor device 11 by means of the current sensor 94a and the current calculating section 94b. At the same time, the voltage measuring section 93 measures a voltage between the emitter and the collector of each IGBT 11a by means of the voltage sensor 93a and the voltage calculating section 93b.

The loss calculating section 95 calculates a loss generated in each IGBT 11a based on the voltage measured by the voltage measuring section 93 and the current measured by the current measuring section 94. Then, the loss of each IGBT 11a thus obtained is summed up so that the loss data D1 indicative of the loss of the switching semiconductor device 11 are acquired.

Then, the loss calculating section 95 stores, in the storage section 21, the loss data D1 thus obtained, the voltage V1 and the current I1 corresponding to each other. In the first embodiment described above, every time any of the IGBTs 11a carries out the switching operation, the loss data are obtained. Herein, only the loss data obtained first are stored in the storage section 21, for example.

Subsequently, the control section 96 changes a voltage to be applied to the switching semiconductor device 11 from the voltage V1 to the voltage V2. Then, the control section 96 applies a predetermined voltage to the control terminal CONT to control the switching operation of each IGBT 11*a* of the switching semiconductor device 11, and causes the current I2 to flow to the output terminals U, V and W. In the same manner as in the case in which the loss data D1 are obtained, thereafter, the control section 96 acquires the loss data D2 at this time. Next, the control section 96 stores the voltage V2, the current I2 and the loss data D2 corresponding to each other in the storage section 21.

Then, the control section 96 changes a voltage to be applied to the switching semiconductor device 11 from the voltage V2 to the voltage V3 to control the switching operation of each IGBT 11*a*, and causes the current I3 to flow to the output terminals U, V and W. In the same manner as in the case in which the loss data D1 and D2 are obtained, the control section 96 acquires the loss data D3 at this time. Thereafter, the control section 96 stores the voltage V3, the current I3 and the loss data D3 corresponding to each other in the storage section 21.

Thus, the initial data are prestored in the storage section 21.

Figures 12, 13:
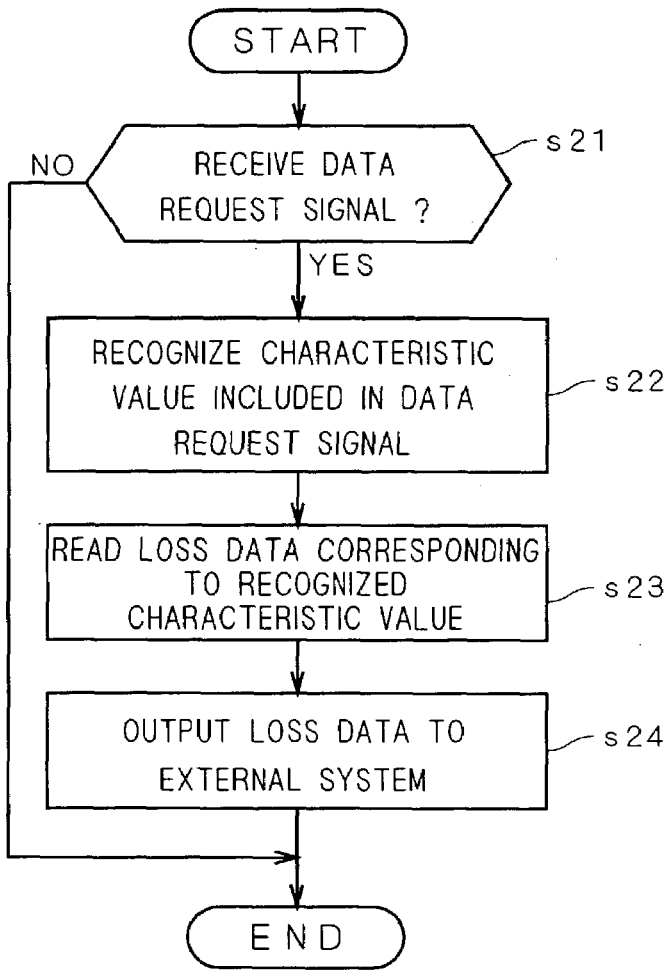
FIG. 12 is a flow chart showing a data output method of the semiconductor module according to the third embodiment of the present invention.
FIG. 13 is a table showing an example of the initial data to be stored in the storage section of the semiconductor module.

Next, an operation of the semiconductor module 20 to be carried out for outputting the loss data to the outside will be described with reference to FIG. 12. As shown in FIG. 12, the data output control section 22 receives a data request signal indicative of an output request for loss data from the motor control section 82 at a step s21. The data request signal also includes information about the characteristic value of the switching semiconductor device corresponding to the loss data which are desired to be output from the semiconductor module 20 by the motor control section 82. In the first embodiment, the motor control section 82 stores, its own storage area, the loss data corresponding to a set voltage and a set current. In the second embodiment, the storage section 21 prestores the loss data corresponding to the voltage and current of the switching semiconductor device 11. Therefore, the motor control section 82 outputs a data request signal to give the semiconductor module 20 a request for outputting loss data corresponding to a set voltage and a set current which are obtained if necessary, more specifically, when a request of a main control section 80 is given.

At a step s22, next, the data output control section 22 recognizes the characteristic value of the switching semiconductor device included in the data request signal thus received. Herein, the characteristic value is represented by the voltage V1 and the current I1, for example.

Then, the data output control section 22 reads the loss data D1 corresponding to the voltage V1 and the current I1 from the storage section 21 at a step s23 and outputs the loss data D1 to the motor control section 82 at a step s24. Upon receipt of the loss data D1, the motor control section 82 outputs the loss data D1 to the main control section 80.

Thus, the loss data corresponding to the characteristic value of the switching semiconductor device which are required by the motor control section 82 are output from the storage section 21 to the motor control section 82.

As described above, the semiconductor module 20 according to the third embodiment comprises the storage section 21 for storing the switching semiconductor device 11 and the loss data corresponding to each other. Differently from the semiconductor modules 10 and 15 according to the first and second embodiments, therefore, the loss data corresponding to the same characteristic value of the switching semiconductor device 11 do not need to be calculated plural times. Consequently, it is possible to more reduce a processing time for the loss data than that in each of the semiconductor modules 10 and 15.

Moreover, the loss data are output in response to the request given from the motor control section 82. Therefore, the motor control section 82 can receive the loss data from the semiconductor module 20 according to its own operating situation. In the same manner as in the semiconductor module 15 described above, consequently, the motor control section 82 can communicate with the semiconductor module 20 at a proper communication load.

Furthermore, the semiconductor module 20 outputs the loss data corresponding to the characteristic value of the switching semiconductor device 11 which are required by the motor control section 82. Therefore, the motor control section 82 does not need to process unnecessary loss data so that a useless processing can be reduced.

In the third embodiment, moreover, the switching semiconductor device 11 and the storage section 21 storing the loss data indicative of a loss are provided inside the semiconductor module 20. For example, in the case in which the storage section 21 is provided in a system of the outside of the semiconductor module 20, that is, is provided in the motor control section 82 and a drawback is generated in the switching semiconductor device 11 so that the semiconductor module 20 is exchanged, loss data corresponding to the switching semiconductor device 11 before the exchange are to be rewritten to loss data corresponding to the switching semiconductor device 11 after the exchange because the loss data before the exchange are stored in the storage section 21 of the motor control section 82. In such a case, therefore, a long time is taken for exchanging the semiconductor module 20.

However, the switching semiconductor device 11 and the storage section 21 are provided in pairs in the semiconductor module 20 according to the third embodiment. Therefore, a long time is not taken for exchanging the semiconductor module 20 differently from the foregoing. Consequently, it is possible to easily exchange the semiconductor module 20.

While the storage section 21 stores the loss data and the characteristic value of the switching semiconductor device 11 corresponding to each other in the third embodiment, the loss data and a characteristic value of a load of the switching semiconductor device may be stored corresponding to each other.

FIG. 13 is a table showing another example of the initial data stored in the storage section 21. Motor torques T1 to T3 in FIG. 13 are a part of motor torques stored in the storage section 21, which are generated in the motor 90 to be a load of the switching semiconductor device 11. The storage section 21 stores a table constituted by loss data and a motor torque generated when a loss indicated by the loss data is made.

The motor torque T1 in FIG. 13 is generated in the motor 90 when a loss indicated by the loss data D1 is made, and the storage section 21 stores the motor torque T1 and the loss data D1 corresponding to each other. Similarly, the motor torque T2 is generated in the motor 90 when a loss indicated by the loss data D2 is made, and the motor torque T3 is generated in the motor 90 when a loss indicated by the loss data D3 is made. The storage section 21 stores the torque T2 and the loss data D2 corresponding to each other, and the torque T3 and the loss data D3 corresponding to each other.

The motor torque has a proportional relationship with a current flowing to the switching semiconductor device 11, more specifically, a current flowing to the output terminals U, V and W and can be obtained from the current. Accordingly, the motor torque is calculated from a current received from the current measuring section 94 by the loss calculating section 95 in the testing device 97 in FIG. 11 and the storage section 21 stores the loss data and the motor torque which are obtained corresponding to each other. Consequently, the initial data shown in FIG. 13 can be stored in the storage section 21.

Moreover, another characteristic value of the motor 90, for example, a motor current may be calculated in place of the motor torque by the loss calculating section 95 in the testing device 97, and the loss data and the motor current may be stored in the storage section 21 corresponding to each other. The motor current can be obtained as an effective value of the current flowing to the switching semiconductor device 11. An equation for calculating the motor current is as follows.

$$Im = \sqrt{3}/2 \cdot Is = Is \cos \omega t$$

In the equation, "Is" represents a maximum value of the current flowing to the switching semiconductor device 11, "ω" represents an angular frequency, and "Im" represents a motor current.

By using the equation described above, the loss calculating section 95 can calculate the motor current from a current measured by the current measuring section 94.

Thus, the characteristic value of the load of the switching semiconductor device 11 and the loss data are stored in the storage section 21 corresponding to each other. Consequently, a suitable semiconductor module can be obtained for a system setting the characteristic value of the load of the switching semiconductor device 11 to be control objectives.

As an example of the case in which the characteristic value of the load of the switching semiconductor device 11 is set to be the control objectives, there will be supposed the case in which the main control section 80 in the system 99 determines an operating point of the motor 90 by only a value of the motor torque. If the motor torque and the loss data are stored in the storage section 21 corresponding to each other, the motor control section 82 can instantaneously recognize loss data corresponding to a value of a candidate for the motor torque determined by the main control section 80.

On the other hand, in the case in which a voltage and a current of the switching semiconductor device 11 and the loss data are stored in the storage section 21 corresponding to each other, it is necessary to obtain a voltage and a current of the switching semiconductor device 11 which are required for generating the motor torque determined by the main control section 80 from the value of the candidate for the same motor torque in order to recognize a loss in the switching semiconductor device 11. For this reason, a time is required for recognizing loss data corresponding to the motor torque.

Accordingly, the storage section 21 stores the characteristic value of the load of the switching semiconductor device 11 and the loss data corresponding to each other so that the effects described above can be obtained.

FIG. 12 is a flow chart showing the operation of the semiconductor module 20 comprising the storage section 21 which stores the characteristic value of the load of the switching semiconductor device 11 and the loss data corresponding to each other as described above, indicating the operation of the semiconductor module 20 for outputting loss data to the outside.

As shown in FIG. 12, first of all, the step s21 is executed. It is assumed that the data request signal includes information about the characteristic value of the load of the switching semiconductor device corresponding to loss data which are desired to be output from the semiconductor module 20 by the motor control section 82 in place of the characteristic value of the switching semiconductor device 11.

At the step s22, next, the data output control section 22 recognizes the characteristic value of the load of the switching semiconductor device which is included in the data request signal thus received. Then, the data output control section 22 reads loss data corresponding to the characteristic value of the load thus recognized at the step s23 and outputs the loss data to the motor control section 82 at the step s24. The motor control section 82 receiving the loss data outputs the same loss data to the main control section 80.

Thus, the loss data corresponding to the characteristic value of the load of the switching semiconductor device which are required by the motor control section 82 are output from the storage section 21 to the motor control section 82.

Figure 14:
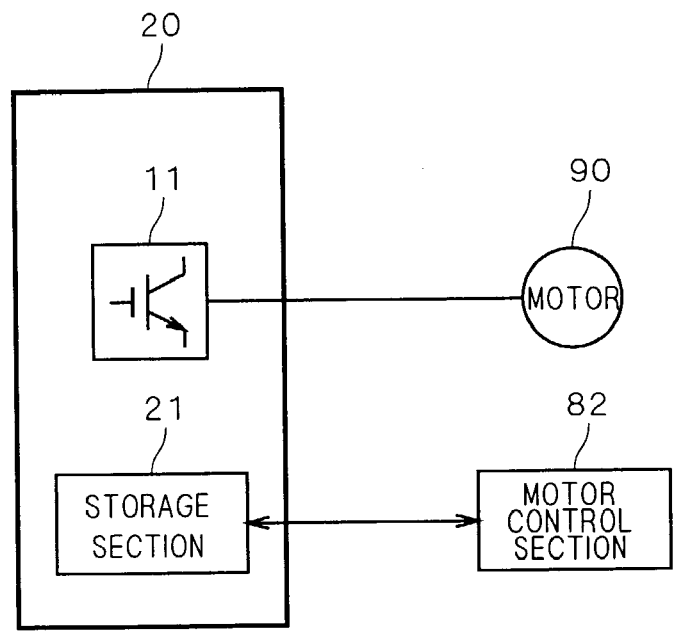
FIG. 14 is a block diagram showing a structure of a variant of the semiconductor module according to the third embodiment of the present invention.

Moreover, while the loss data are output from the storage section 21 through the data output control section 22 in the third embodiment, the loss data may be directly output from the storage section 21. FIG. 14 is a block diagram showing a variant of the semiconductor module 20 according to the third embodiment. In the variant of the semiconductor module 20 shown in FIG. 14, the data output control section 22 shown in FIG. 9 is not provided, and the motor control section 82 can directly read data from the storage section 21. For example, in the case in which the storage section 21 is constituted by an RAM, an address signal and a control signal are directly sent from the motor control section 82 to the storage section 21 and the storage section 21 directly outputs internal data to the motor control section 82 based on these signals.

The motor control section 82 can read necessary loss data based on the characteristic value of the switching semiconductor device 11 or the characteristic value of the load thereof in the storage section 21.

Thus, the data in the storage section 21 are directly read by an external system so that the data output control section 22 for controlling the output of the loss data is not required and a circuit structure of the semiconductor module 20 can be simplified. Moreover, the storage section 21 outputs the loss data in response to the request of the motor control section 82 (for example, an address signal and a control signal). Consequently, the motor control section 82 can communicate with the semiconductor module 20 at a proper communication load.

Fourth Embodiment

Figure 15:
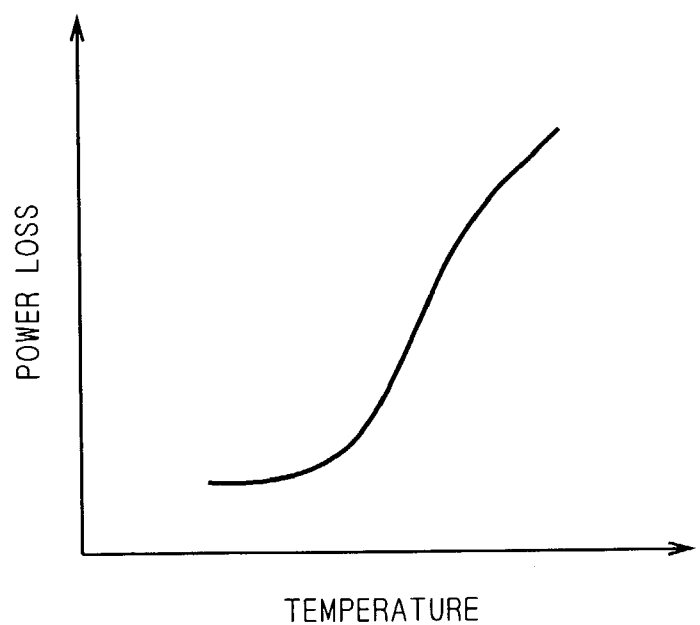
FIG. 15 is a graph showing a relationship between a power loss and a temperature.

In general, a loss generated in the switching semiconductor device 11 depends on a temperature of the switching semiconductor device 11 as shown in FIG. 15. There is a tendency that the loss is increased when the temperature of the switching semiconductor device 11 is raised. For this reason, in some cases in which loss data obtained previously irrespective of the temperature of the switching semiconductor device 11 are to be output to an external system as in the semiconductor module 20 according to the third embodiment, a value of a loss indicated by the loss data is different from a value of an actual loss in the switching semiconductor device 11 which is generated when the external system receives the loss data. Therefore, a fourth embodiment proposes a semiconductor module in which loss data having high precision are output to the outside even if the temperature of the switching semiconductor device 11 is changed.

Figure 16:
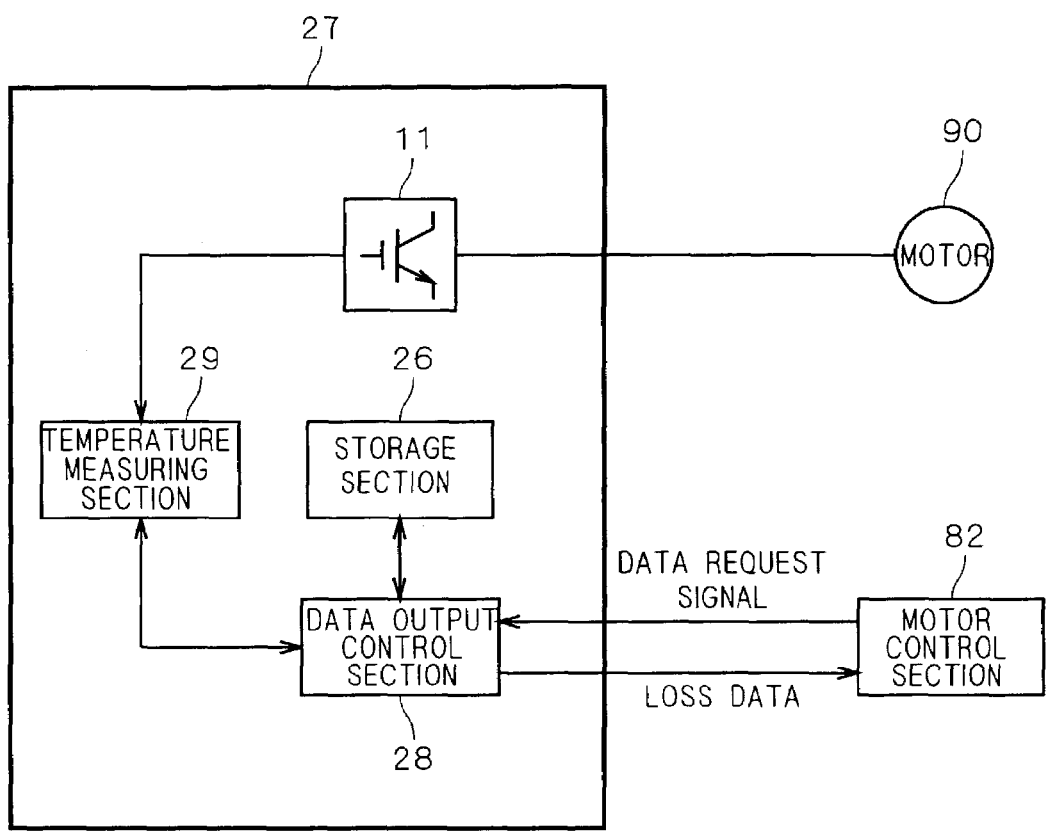
FIG. 16 is a block diagram showing a structure of a semiconductor module according to a fourth embodiment of the present invention.

FIG. 16 is a block diagram showing a structure of a semiconductor module 27 according to the fourth embodiment of the present invention. In the semiconductor module 20 according to the third embodiment shown in FIG. 9, basically, the semiconductor module 27 according to the fourth embodiment further comprises a temperature measuring section 29 for measuring a temperature of the switching semiconductor device 11 internally, a storage section 26 in place of the storage section 21, and a data output control section 28 in place of the data output control section 22. In the fourth embodiment, the semiconductor module 27 shown in FIG. 16 is employed in the system 99 in place of the semiconductor module 10.

The temperature measuring section 29 measures the temperature of the switching semiconductor device 11 in response to a request of the data output control section 28 and outputs the measured temperature to the data output control section 28. The temperature measuring section 29 measures a temperature of one of IGBTs 11a provided in the switching semiconductor device 11 and outputs the measured temperature as the temperature of the switching semiconductor device 11, for example.

The storage section 26 stores, as initial data, a characteristic value of the switching semiconductor device 11 and loss data corresponding to each other, and the characteristic value includes a temperature, a voltage and a current of the switching semiconductor device 11. In other words, the storage section 26 according to the second embodiment stores the initial data stored in the storage section 21 according to the third embodiment to which the temperature is further added as another characteristic value of the switching semiconductor device 11. Such data are stored in the storage section 26 at a pre-shipment inspecting step in a process for manufacturing the semiconductor module 27, for example.

FIG. 17 is a table showing an example of the initial data stored in the storage section 26. As shown in FIG. 17, the storage section 26 stores a table constituted by a temperature of the switching semiconductor device, loss data obtained at that temperature, and a voltage and a current of the switching semiconductor device with which a loss indicated by the loss data is generated. In FIG. 17, temperatures Temp 1 and Temp 2 represent a part of the temperatures of the switching semiconductor device 11 stored in the storage section 26.

In FIG. 17, loss data D1 and D2 represent loss data obtained at the temperature Temp 1 of the switching semiconductor device 11, and loss data D11 and D12 represent loss data obtained at the temperature Temp 2 of the switching semiconductor device 11. A voltage applied to the switching semiconductor device 11 when a loss indicated by the loss data D1 or the loss data D11 is generated is represented by a voltage V1, and a current flowing to the switching semiconductor device 11 at that time is represented by a current I1. Moreover, a voltage applied to the switching semiconductor device 11 when a loss indicated by the loss data D2 or the loss data D12 is generated is represented by a voltage V2, and a current flowing to the switching semiconductor device 11 at that time is represented by a current I2.

The loss data D1, the voltage V1, the current I1 and the temperature Temp 1 are stored corresponding to each other, and the loss data D2, the voltage V2, the current I2 and the temperature Temp 1 are stored corresponding to each other. Moreover, the loss data D11, the voltage V1, the current I1 and the temperature Temp 2 are stored corresponding to each other, and the loss data D12, the voltage V2, the current I2 and the temperature Temp 2 are stored corresponding to each other.

Such initial data can be prestored in the storage section 26 by the following method.

The testing device 97 shown in FIG. 11 further includes a temperature measuring section for measuring the temperature of one of the IGBTs 11a provided in the switching semiconductor device 11 of the semiconductor module 27 and for outputting the measured temperature as the temperature of the switching semiconductor device 11, for example. Then, the temperature measured by the temperature measuring section is input to a loss calculating section 95. Thereafter, the loss calculating section 95 stores, in the storage section 26, the temperature received from the temperature measuring section, loss data which are obtained, and a characteristic value received from a control section 96 corresponding to each other. By putting the semiconductor module 27 in a thermostatic oven or the like, the temperature of the switching semiconductor device 11 is changed and the testing device 97 executes the above-mentioned operation at each temperature. Consequently, the initial data shown in FIG. 17 can be stored in the storage section 26.

Moreover, the storage section 26 may store the characteristic value of the load of the switching semiconductor device 11, the temperature of the switching semiconductor device 11 and the loss data corresponding to each other in place of the data shown in FIG. 17. For example, it is also possible to store a temperature of the switching semiconductor device 11, loss data obtained at that temperature, and a motor torque generated in a motor 90 when a loss indicated by the loss data is made as shown in FIG. 18 corresponding to each other. Furthermore, a motor current may be stored in place of the motor torque shown in FIG. 18.

It is a matter of course that the motor torque and motor current to be stored in the storage section 26 can be obtained by the method described in the third embodiment.

Next, an operation for outputting loss data to the outside in the semiconductor module 27 comprising the storage section 26 storing the initial data shown in FIG. 17 will be described with reference to FIG. 19.

Figure 19:
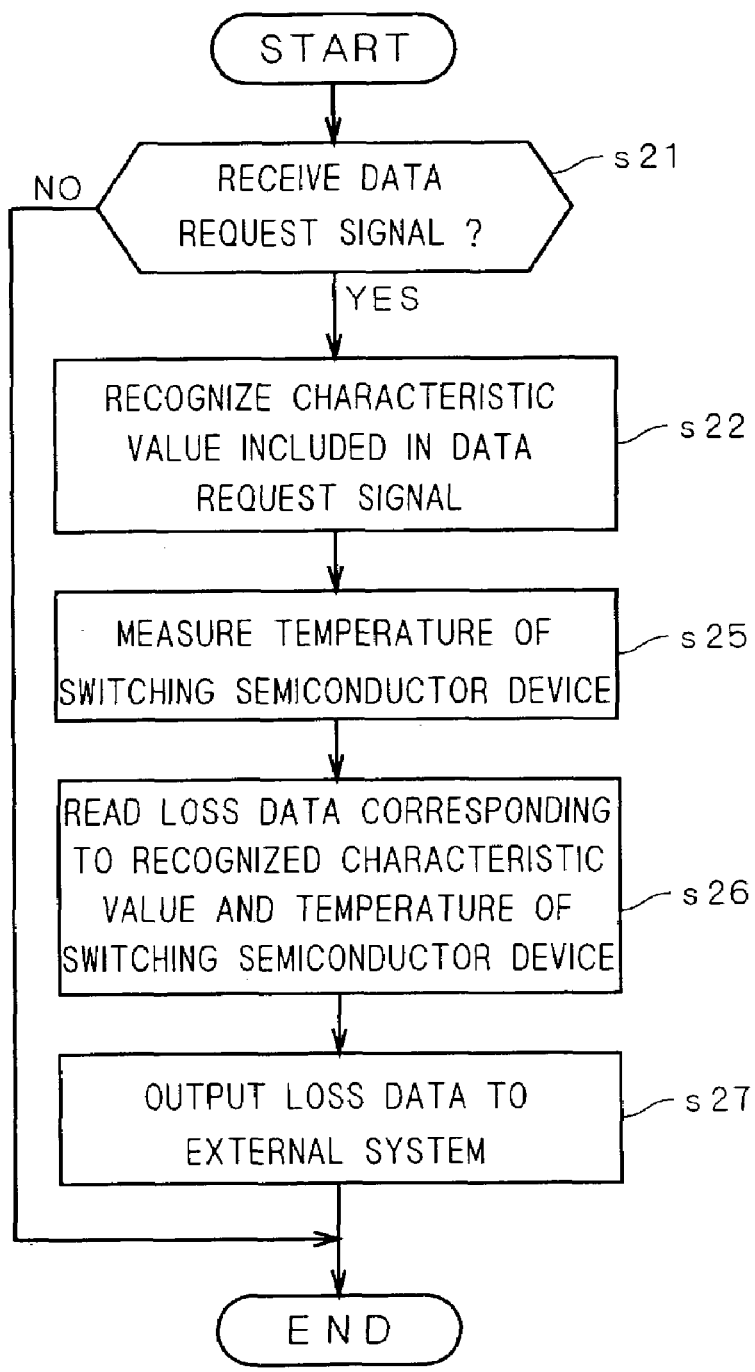
FIG. 19 is a flow chart showing a data output method of the semiconductor module according to the fourth embodiment of the present invention.

As shown in FIG. 19, the steps s21 and s22 shown in FIG. 12 are executed. Consequently, the data output control section 28 recognizes a characteristic value of the switching semiconductor device included in a data request signal which is received. Herein, the characteristic value is set to be a voltage V1 and a current I1, for example.

Then, the data output control section 28 gives a request for measuring a temperature of the switching semiconductor device 11 to the temperature measuring section 29 at a step s25. The temperature measuring section 29 receiving the request measures the temperature of the switching semiconductor device 11 and outputs the measured temperature to the data output control section 28. Herein, the temperature measured by the temperature measuring section 29 is represented by the temperature Temp 1.

Next, the data output control section 28 reads loss data D1 corresponding to the received temperature Temp 1 and the voltage V1 and the current I1 which are the recognized characteristic values at a step s26, and outputs the loss data D1 to a motor control section 82 at a step s27. The motor control section 82 receiving the loss data D1 outputs the loss data D1 to a main control section 80.

Thus, loss data corresponding to the characteristic values (the voltage and the current) of the switching semiconductor device which are required by the motor control section 82 and the temperature measured by the temperature measuring section 29 when a request is given from the motor control section 82 are output from the storage section 26 to the motor control section 82.

With reference to FIG. 19, next, brief description will be given to an operation for outputting loss data to the outside in the semiconductor module 27 comprising the storage section 26 storing the characteristic value of the load of the switching semiconductor device 11, the temperature of the switching semiconductor device 11 and the loss data corresponding to each other.

First of all, the same step s21 as that shown in FIG. 12 is executed. Herein, it is assumed that a data request signal includes information about the characteristic value of the load of the switching semiconductor device 11 corresponding to the loss data which are desired to be output from the semiconductor module 20 by the motor control section 82, for example, a motor torque and a motor current in place of the characteristic value of the switching semiconductor device 11.

Then, the same step s22 as that shown in FIG. 12 is executed. Consequently, the data output control section 28 recognizes the characteristic value of the load of the switching semiconductor device 11 which is included in the data request signal thus received.

Thereafter, the data output control section 28 gives a request for measuring a temperature of the switching semiconductor device 11 to the temperature measuring section 29 at a step s25. The temperature measuring section 29 receiving the request measures the temperature of the switching semiconductor device 11 and outputs the measured temperature to the data output control section 28.

Next, the data output control section 28 reads loss data corresponding to the received temperature and the characteristic value of the load thus recognized at a step s26 and outputs the loss data to the motor control section 82 at a step s27. The motor control section 82 receiving the loss data outputs the loss data to the main control section 80.

Thus, loss data corresponding to the characteristic value of the load of the switching semiconductor device which is required by the motor control section 82 and the temperature measured by the temperature measuring section 29 when a request is given from the motor control section 82 are output from the storage section 26 to the motor control section 82.

As described above, according to the semiconductor module 27 in accordance with the fourth embodiment, the loss data corresponding to the temperature of the switching semiconductor device 11 are output to an external system. Also in the case in which the temperature of the switching semiconductor device 11 is changed, therefore, loss data having high precision can be output to the external system.

Furthermore, the temperature measuring section 29 is provided inside the semiconductor module 27. Therefore, a result of the measurement is not influenced by an impedance of a connecting terminal with the outside which is provided in a package of the semiconductor module 27 or the like. Therefore, the temperature of the switching semiconductor device 11 can be measured more accurately than in the case in which the temperature measuring section 29 is provided on the outside of the semiconductor module 27.

Moreover, the loss data are output in response to the request given from the motor control section 82. Therefore, the motor control section 82 can receive the loss data from the semiconductor module 27 according to its own operating situation. In the same manner as in the semiconductor modules 15 and 20 described above, consequently, the motor control section 82 can communicate with the semiconductor module 27 at a proper communication load.

Furthermore, the loss data corresponding to the characteristic value required by the motor control section 82 are output to the motor control section 82. Therefore, the motor control section 82 does not need to process unnecessary loss data so that a useless processing can be reduced.

In the case in which the system provided on the outside of the semiconductor module 27, for example, the motor control section 82 includes a temperature measuring section for measuring the temperature of the switching semiconductor device 11, the semiconductor module 27 does not need to include the temperature measuring section 29. In this case, information about a temperature measured by the temperature measuring section provided in the motor control section 82 is included in information about the characteristic value of the switching semiconductor device in the data request signal or is further added to information about the characteristic value of the load of the switching semiconductor device in the data request signal so that the data output control section 28 can also recognize the temperature of the switching semiconductor device 11. Loss data corresponding to the temperature can be read from the storage section 26 and can be then output to the motor control section 82.

Fifth Embodiment

Figure 20:
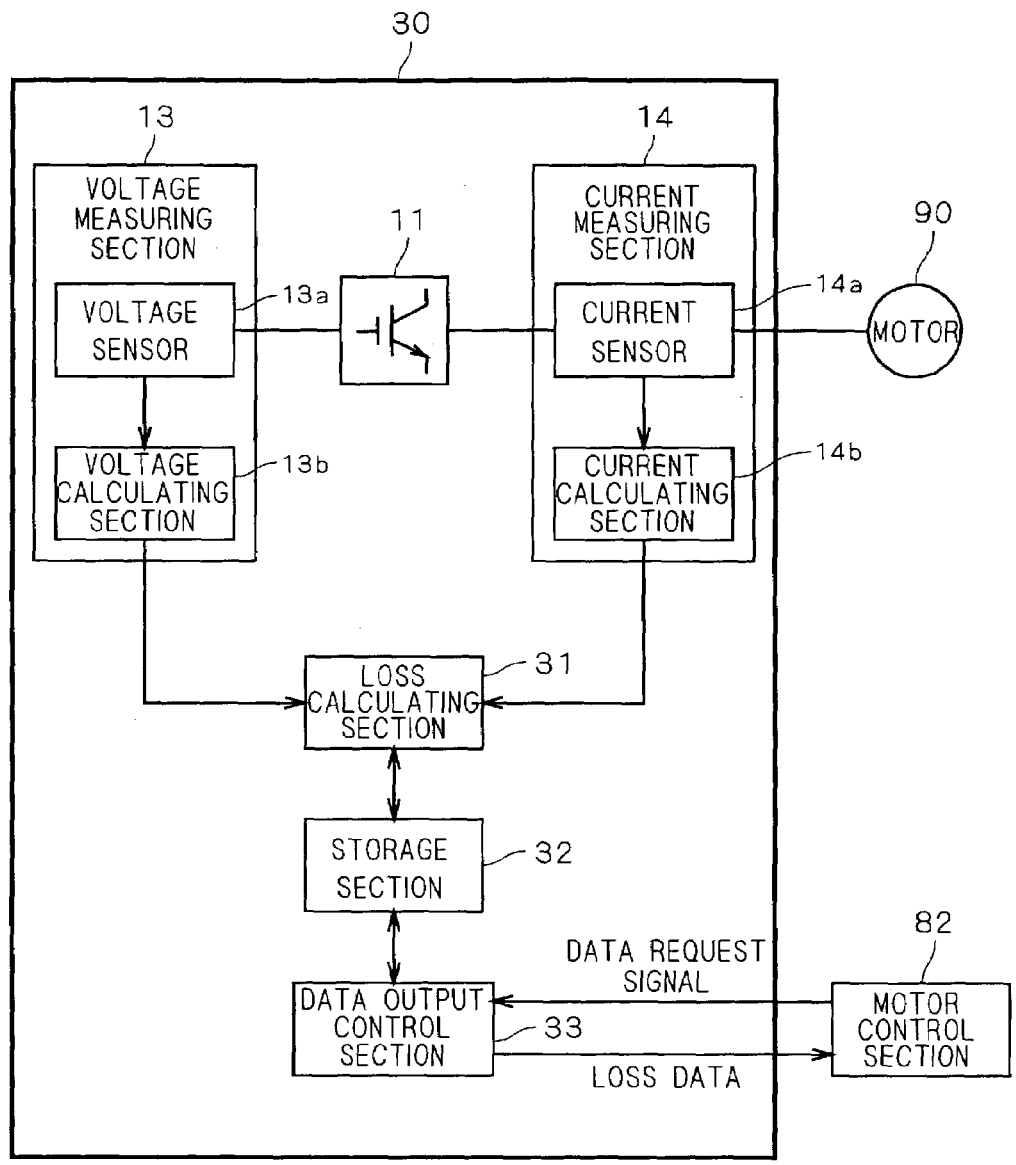
FIG. 20 is a block diagram showing a structure of a semiconductor module according to a fifth embodiment of the present invention.

FIG. 20 is a block diagram showing a structure of a semiconductor module 30 according to a fifth embodiment of the present invention. The semiconductor module 30 according to the fifth embodiment comprises the switching semiconductor device 11, the voltage measuring section 13 and the current measuring section 14 which are described above, a loss calculating section 31, a storage section 32 and a data output control section 33, and these components are accommodated in one package. In the fifth embodiment, the semiconductor module 30 shown in FIG. 20 is employed in place of the semiconductor module 10 in the system 99 described above.

The loss calculating section 31 calculates loss data based on a voltage measured by the voltage measuring section 13 and a current measured by the current measuring section 14. A specific method of obtaining the loss data is the same as the method according to the first embodiment. Moreover, the loss calculating section 31 stores, in the storage section 32, the loss data thus obtained and a characteristic value of the switching semiconductor device 11 corresponding to each other. More specifically, the loss data thus obtained and a voltage and a current of the switching semiconductor device 11 which are obtained when a loss indicated by the loss data is made are stored corresponding to each other in the storage section 32. The voltage and the current of the switching semiconductor device 11 can be recognized from the voltage measured by the voltage measuring section 13 and the current measured by the current measuring section 14 independently of the calculation of the loss, respectively.

If a set of the voltage of the switching semiconductor device 11 which is recognized from the voltage measured by the voltage measuring section 13 and the current of the switching semiconductor device 11 which is recognized from the current measured by the current measuring section 14 has already been stored in the storage section 32 before the loss is calculated, moreover, the loss calculating section 31 does not calculate the loss at that time and does not write the voltage and the current of the switching semiconductor device 11 to the storage section 32. Consequently, the loss data for the same characteristic value of the switching semiconductor device 11 are not obtained plural times.

The loss calculating section 31 may store, in the storage section 32, a characteristic value of a load of the switching semiconductor device 11 and loss data corresponding to each other. More specifically, the loss calculating section 31 may store, in the storage section 32, the loss data thus obtained and a motor torque and a motor current in a motor 90 which are obtained when a loss indicated by the loss data is generated corresponding to each other. In the case in which the characteristic value of the load thus obtained has already been stored in the storage section 32, the loss is not calculated at that time.

Thus, the storage section 32 stores the data shown in FIG. 10 and the data shown in FIG. 13, for example.

Figure 21:
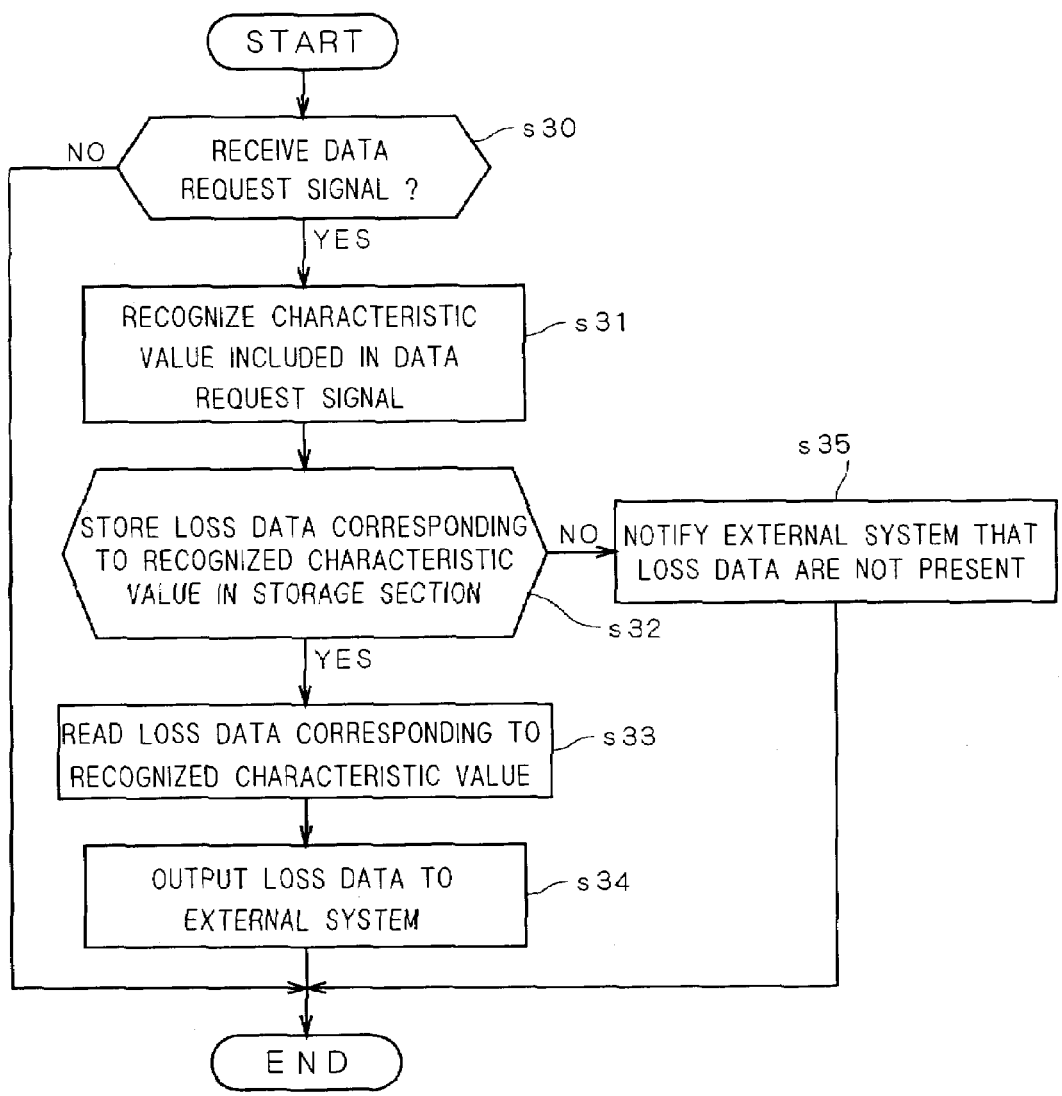
FIG. 21 is a flow chart showing a data output method of the semiconductor module according to the fifth embodiment of the present invention.

With reference to FIG. 21, next, description will be given to an operation of the semiconductor module 30 according to the fifth embodiment which is to be carried out for outputting the loss data to the outside. As shown in FIG. 21, the data output control section 33 receives a data request signal from a motor control section 82 at a step s30. The data request signal includes information about the characteristic value of the switching semiconductor device 11 and information about the characteristic value of the load thereof corresponding to the loss data which are desired to be output from the semiconductor module 30 by the motor control section 82. In some cases, one of the characteristic value of the switching semiconductor device 11 and the characteristic value of the load thereof will be hereinafter referred to as a "characteristic value".

At a step s31, next, the data output control section 33 recognizes the characteristic value included in the data request signal thus received.

Then, the data output control section 33 decides whether or not loss data corresponding to the recognized characteristic value are stored in the storage section 32 at a step s32. Thereafter, when the data output control section 33 decides that the loss data are not stored in the storage section 32, it gives the notice to the motor control section 82 at a step s35. The motor control section 82 receiving the notice notifies a main control section 80 that loss data corresponding to an operating point determined by the main control section 80 are not present. The main control section 80 excludes the operating point having no loss data from a candidate, for example.

On the other hand, when the data output control section 33 decides that the loss data corresponding to the characteristic value recognized at the step s31 are present in the storage section 32 at the step s32, the loss data are read from the storage section 32 at a step s33. Then, loss data read at a step s34 are output to the motor control section 82.

Thus, the loss data corresponding to the characteristic value required by the motor control section 82 are output from the storage section 32 to the motor control section 82.

As described above, the semiconductor module 30 according to the fifth embodiment comprises the storage section 32 for storing the characteristic value and the loss data corresponding to each other. Differently from the semiconductor modules 10 and 15 according to the first and second embodiments, therefore, the loss data corresponding to the same characteristic value do not need to be obtained plural times. Consequently, it is possible to more reduce a processing time for the loss data than that in each of the semiconductor modules 10 and 15.

Moreover, the loss data are output in response to the request given from the motor control section 82. Therefore, the motor control section 82 can receive the loss data from the semiconductor module 30 according to its own operating situation. In the same manner as in the semiconductor modules 15 and 20 described above, consequently, the motor control section 82 can communicate with the semiconductor module 30 at a proper communication load.

Furthermore, the loss data corresponding to the characteristic value required by the motor control section 82 are output to the motor control section 82. Therefore, the motor control section 82 does not need to process unnecessary loss data so that a useless processing can be reduced.

In the semiconductor module 30 according to the fifth embodiment, moreover, a voltage and a current of each IGBT 11a in the switching semiconductor device 11 are measured inside the semiconductor module 30. In the same manner as in the semiconductor module 10 described above, therefore, the voltage and the current can be measured accurately. As a result, loss data having high precision can be provided to an external system.

Figure 22:
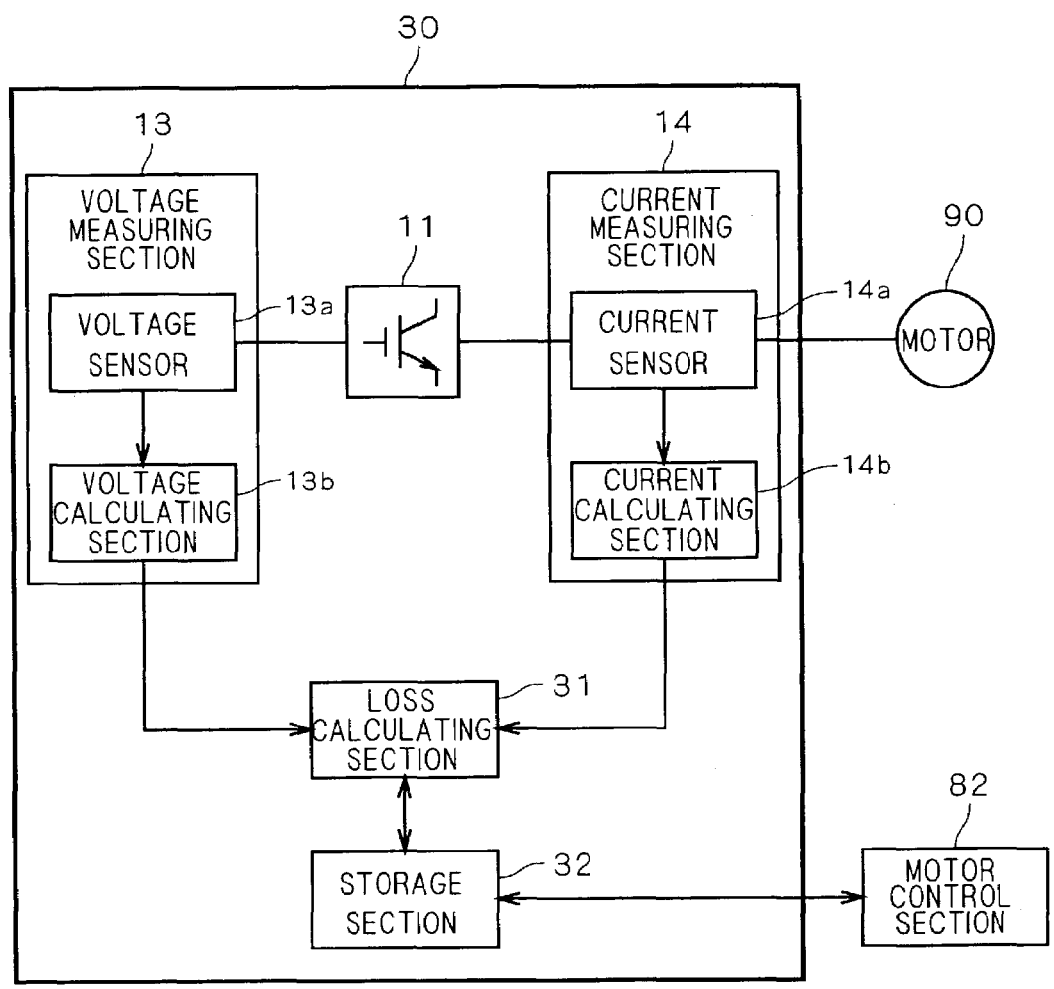
FIG. 22 is a block diagram showing a structure of a variant of the semiconductor module according to the fifth embodiment of the present invention.

While the loss data are output from the storage section 32 through the data output control section 33 in the fifth embodiment, the loss data may be directly output from the storage section 32 in the same manner as in the semiconductor module 20 shown in FIG. 14. FIG. 22 is a block diagram showing the semiconductor module 30 in this case.

Data of the storage section 32 shown in FIG. 22 can be directly read by the motor control section 82. For example, in the case in which the storage section 32 is constituted by an RAM, an address signal and a control signal are directly sent from the motor control section 82 to the storage section 32 and the storage section 32 directly outputs internal data to the motor control section 82 based on these signals.

The motor control section 82 can read necessary loss data based on the characteristic value of the switching semiconductor device 11 and the characteristic value of the load thereof in the storage section 32.

Thus, the data in the storage section 32 are directly read by an external system so that the data output control section 33 for controlling the output of the loss data is not required and a circuit structure of the semiconductor module 30 can be simplified. Moreover, the storage section 32 outputs the loss data in response to the request of the motor control section 82 (for example, an address signal and a control signal). Consequently, the motor control section 82 can communicate with the semiconductor module 30 at a proper communication load.

Sixth Embodiment

Figure 23:
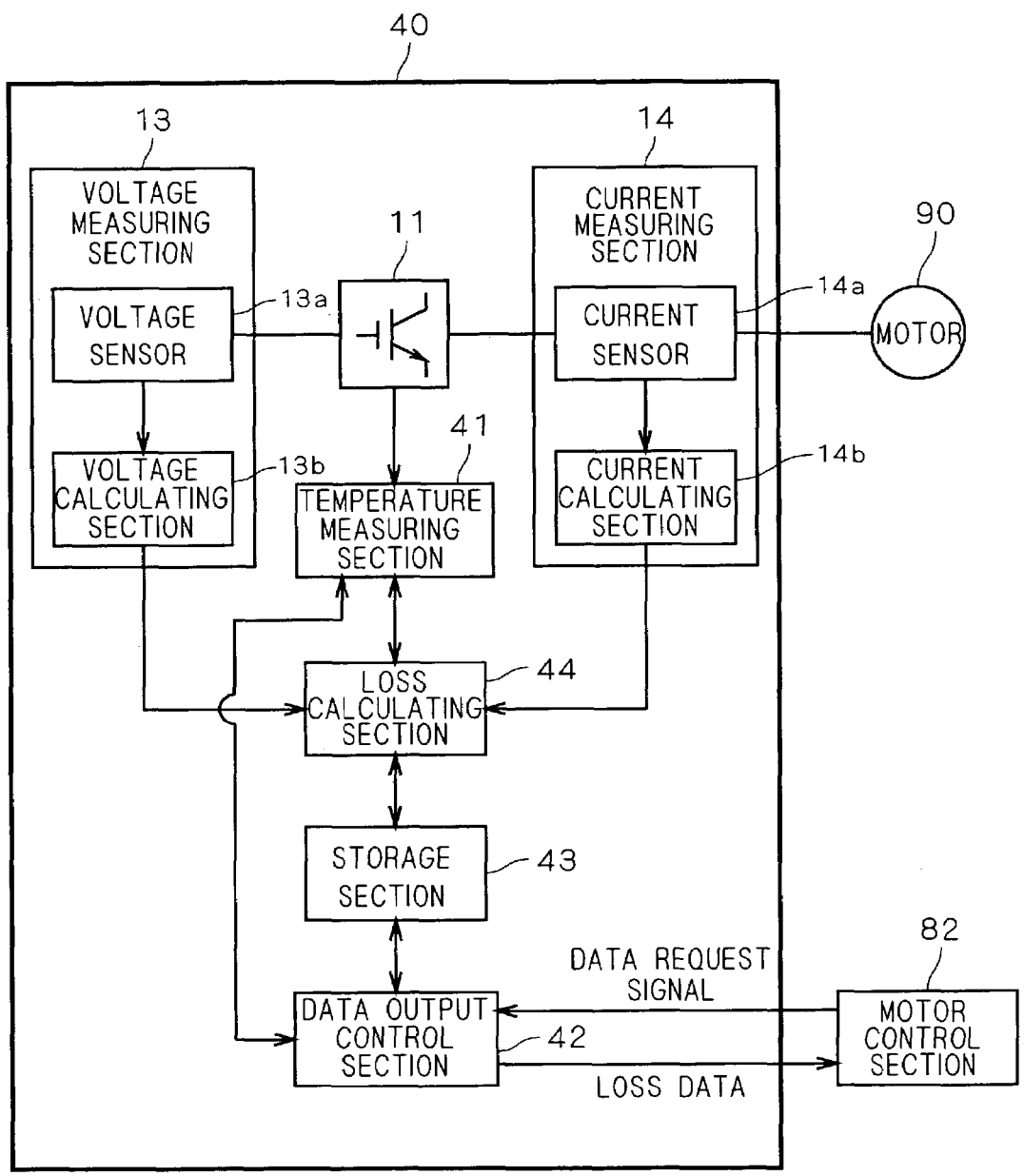
FIG. 23 is a block diagram showing a structure of a semiconductor module according to a sixth embodiment of the present invention.

FIG. 23 is a block diagram showing a structure of a semiconductor module 40 according to a sixth embodiment of the present invention. In the semiconductor module 30 according to the fifth embodiment, basically, the semiconductor module 40 according to the sixth embodiment further comprises a temperature measuring section 41 for measuring a temperature of the switching semiconductor device 11 internally, a loss calculating section 44 in place of the loss calculating section 31, a storage section 43 in place of the storage section 32, and a data output control section 42 in place of the data output control section 33. In the sixth embodiment, the semiconductor module 40 shown in FIG. 23 is employed in the system 99 in place of the semiconductor module 10.

The temperature measuring section 41 measures the temperature of the switching semiconductor device 111 in response to a request of the loss calculating section 44 and outputs the measured temperature to the loss calculating section 44. Moreover, the temperature measuring section 41 measures the temperature of the switching semiconductor device 11 in response to a request of the data output control section 42 and outputs the measured temperature to the data output control section 42. In the case in which the requests of the loss calculating section 44 and the data output control section 42 compete with each other, priority is given to the request of the loss calculating section 44 and the temperature thus obtained is output to the loss calculating section 44, and the same temperature is then output to the data output control section 42. The temperature measuring section 41 measures a temperature of one of IGBTs 11a provided in the switching semiconductor device 11 and outputs the measured temperature as the temperature of the switching semiconductor device 11, for example.

The loss calculating section 44 obtains loss data based on a voltage measured by a voltage measuring section 13 and a current measured by a current measuring section 14. A specific method of obtaining the loss data is the same as the method described in the first embodiment. Upon receipt of results of the measurement from the voltage measuring section 13 and the current measuring section 14, the loss calculating section 44 gives a request for measuring the temperature of the switching semiconductor device 11 to the temperature measuring section 41 before the loss data are obtained. The temperature measuring section 41 receiving the request measures the temperature of the switching semiconductor device 11 and outputs a result of the measurement to the loss calculating section 44.

Then, the loss calculating section 44 stores, in the storage section 43, the loss data thus obtained and a characteristic value of the switching semiconductor device 11 corresponding to each other. More specifically, the loss calculating section 44 stores, in the storage section 43, the loss data thus obtained, the temperature of the switching semiconductor device 11 which is received from the temperature measuring section 41, and a voltage and a current of the switching semiconductor device 11 which are obtained when a loss indicated by the loss data is generated corresponding to each other. The voltage and the current of the switching semiconductor device 11 can be recognized from the voltage measured by the voltage measuring section 13 and the current measured by the current measuring section 14 independently of the calculation of the loss, respectively.

Moreover, the loss calculating section 44 decides whether or not a set of the voltage of the switching semiconductor device 11 which is recognized from the voltage measured by the voltage measuring section 13, the current of the switching semiconductor device 11 which is recognized from the current measured by the current measuring section 14 and the temperature of the switching semiconductor device 11 which is received from the temperature measuring section 41 has already been stored in the storage section 43 before the loss is calculated. If the set is stored, the loss calculating section 44 does not calculate a loss at that time and does not write the temperature, voltage and current of the switching semiconductor device 11 to the storage section 43. Consequently, loss data for the same characteristic value of the switching semiconductor device 11 are not obtained plural times.

The loss calculating section 44 may store, in the storage section 43, the temperature of the switching semiconductor device 11, the characteristic value of the load of the switching semiconductor device 11 and the loss data corresponding to each other. More specifically, the loss calculating section 44 may store, in the storage section 43, the loss data thus obtained, the temperature of the switching semiconductor device 11 which is received from the temperature measuring section 41, and a motor torque and a motor current in a motor 90 which are obtained when a loss indicated by the loss data is generated corresponding to each other. In this case, if a set of the temperature received from the temperature measuring section 41 and the characteristic value of the load thus obtained has already been stored in the storage section 43, a loss is not calculated at that time.

Thus, the storage section 43 stores the data shown in FIG. 17 and the data shown in FIG. 18, for example.

Figure 24:
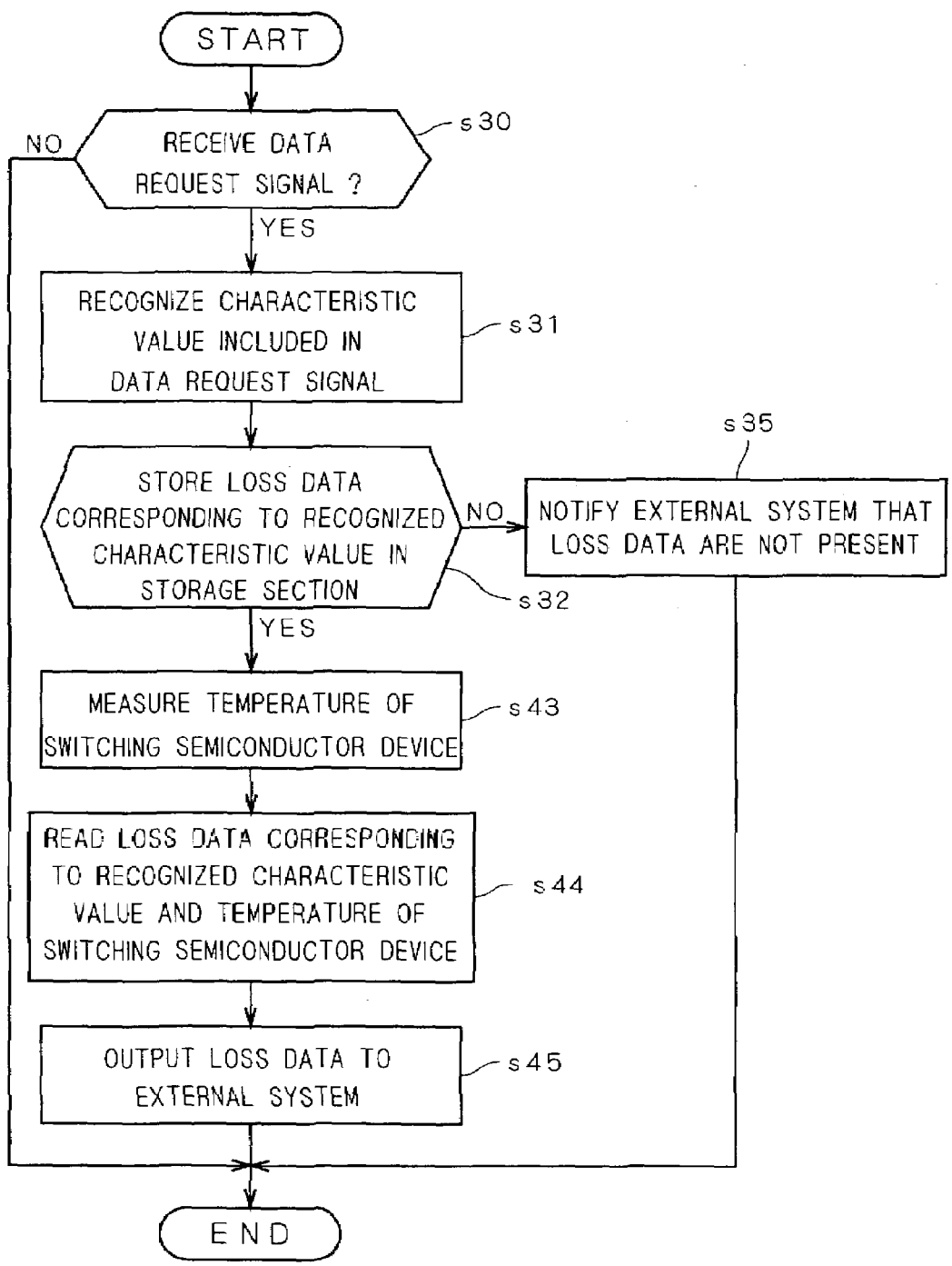
FIG. 24 is a flow chart showing a data output method of the semiconductor module according to the sixth embodiment of the present invention.

With reference to FIG. 24, next, description will be given to an operation of the semiconductor module 40 according to the sixth embodiment which is to be carried out for outputting the loss data to the outside. As shown in FIG. 24, the same steps s30 and s31 as those in FIG. 21 are executed. Consequently, the data output control section 42 recognizes a characteristic value included in the received data request signal.

Then, the same step s32 as that shown in FIG. 21 is executed. If the data output control section 42 decides that loss data corresponding to the characteristic value recognized at the step s31 are not stored in the storage section 43 at the step s32, a step s35 is executed.

On the other hand, if the data output control section 42 decides that the loss data corresponding to the characteristic value recognized at the step s31 are present in the storage section 32 at the step s32, it gives a request for measuring a temperature to the temperature measuring section 41 at a step s43. The temperature measuring section 41 receiving the request measures the temperature of the switching semiconductor device 11 and outputs a result of the measurement to the data output control section 42.

The data output control section 42 reads, from the storage section 43, loss data corresponding to the characteristic value recognized at the step s31 and the temperature of the switching semiconductor device 11 which is received from the temperature measuring section 41 at a step s44, and outputs the loss data to a motor control section 82 at a step s45.

Thus, loss data corresponding to the temperature of the switching semiconductor device 11 and a characteristic value required by the motor control section 82 are output from the storage section 43 to the motor control section 82.

As described above, according to the semiconductor module 40 in accordance with the sixth embodiment, the loss data corresponding to the temperature of the switching semiconductor device 11 are output to an external system in addition to the function of the semiconductor module 30 according to the fifth embodiment. In addition to the effects of the semiconductor module 30, therefore, loss data having high precision can be provided to the external system even if the temperature of the switching semiconductor device 11 is changed.

Furthermore, the temperature measuring section 41 is provided inside the semiconductor module 40. Consequently, the temperature of the switching semiconductor device 11 can be measured more accurately than in the case in which the temperature measuring section 41 is provided on the outside of the semiconductor module 40.

Seventh Embodiment

While the case in which the motor is used as the load of the switching semiconductor device provided in the semiconductor module has been described in the first to sixth embodiments, there will be described the case in which other loads, for example, a capacitor and a reactor are used.

Figure 25:
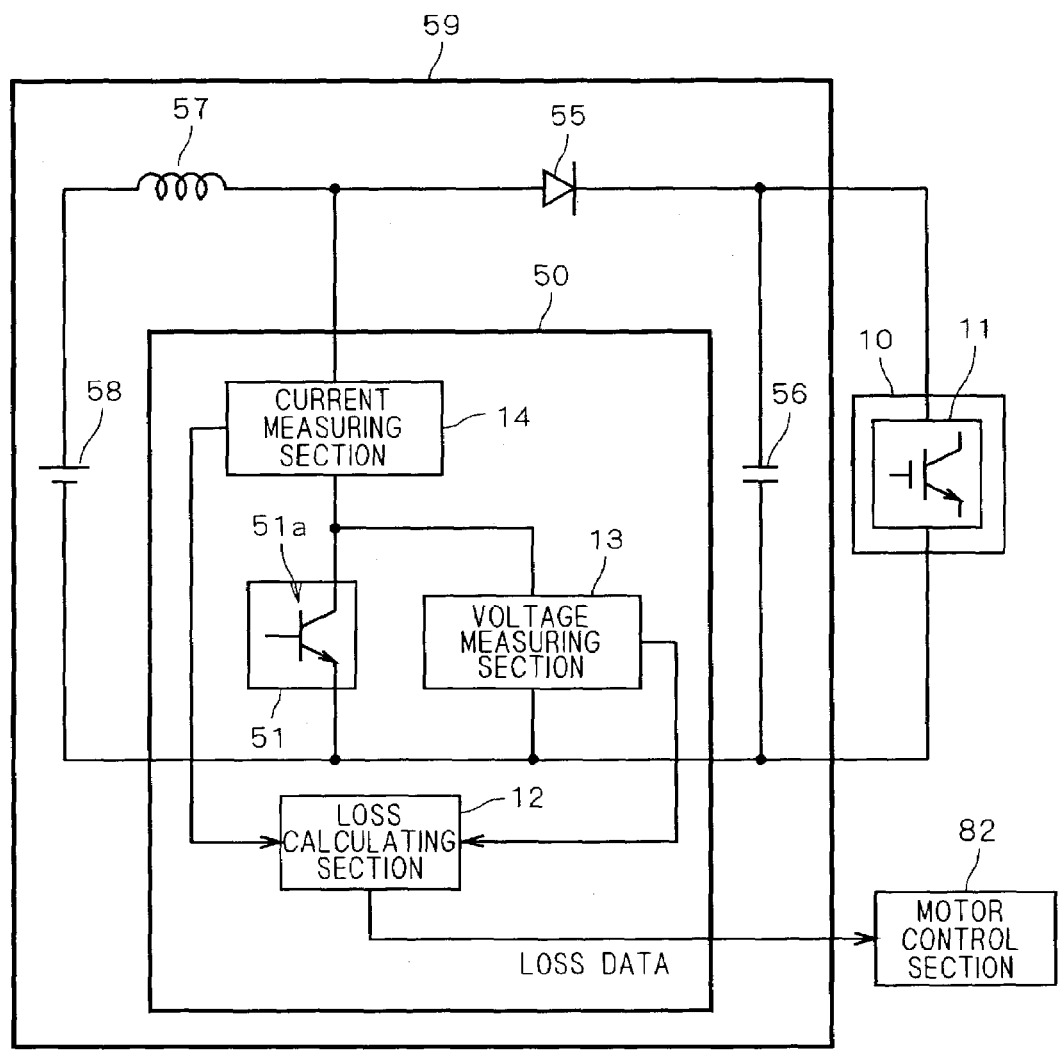
FIG. 25 is a block diagram showing a structure of a semiconductor module according to a seventh embodiment of the present invention.

FIG. 25 is a block diagram showing a structure of a semiconductor module 50 according to a seventh embodiment of the present invention. In the semiconductor module 10 according to the first embodiment, basically, the semiconductor module 50 according to the seventh embodiment comprises a switching semiconductor device 51 in place of the switching semiconductor device 11.

The switching semiconductor device 51 is provided with one bipolar transistor 51a as a switching element, and connected with a capacitor 56 and a reactor 57 as loads on the outside of the semiconductor module 50.

One of ends of the reactor 57 and an anode of a diode 55 provided on the outside of the semiconductor module 50 are connected with a collector of the bipolar transistor 51a through a current sensor 14a (not shown) of a current measuring section 14. A minus power terminal of a battery 58 provided on the outside of the semiconductor module 50 and one of ends of the capacitor 56 are connected with an emitter of the bipolar transistor 51a. The other end of the reactor 57 is connected with a plus power terminal of the battery 58, and the other end of the capacitor 56 is connected with a cathode of the diode 55.

The semiconductor module 50, the battery 58, the reactor 57, the diode 55 and the capacitor 56 shown in FIG. 25 are provided in the motor system 71, for example, and they constitute a switching power circuit 59. For example, a base voltage of the bipolar transistor 51a is controlled by a motor control section 82 and a switching operation of the bipolar transistor 51a is controlled.

A voltage ranging from an output voltage Vt of the battery 58 to a double voltage thereof is generated on both ends of the capacitor 56 according to a switching frequency of the bipolar transistor 51a. The voltage generated on both ends of the capacitor 56 is applied to the input terminals P and N of the switching semiconductor device 11 according to the first embodiment, for example. Consequently, a voltage of the switching semiconductor device 11 is determined by the voltage of the capacitor 56. In the first to sixth embodiments, there has been described the example in which the motor control section 82 supplies the voltage of the switching semiconductor device 11. In such an example, the switching power circuit 59 shown in FIG. 25 is provided in the motor control section 82.

The current measuring section 14 of the semiconductor module 50 measures a current between the collector and the emitter of the bipolar transistor 51a, and a voltage measuring section 13 measures a voltage between the collector and the emitter of the bipolar transistor 51a.

A loss calculating section 12 obtains loss data indicative of a loss generated in the switching semiconductor device 51 based on the voltage measured by the voltage measuring section 13 and the current measured by the current measuring section 14, and outputs the loss data to the motor control section 82. Herein, loss data indicative of a loss generated in the bipolar transistor 51a by one switching operation are output as loss data of the switching semiconductor device 51. A specific method of obtaining the loss data can be the same as the method described in the first embodiment.

Thus, the semiconductor module 50 according to the seventh embodiment outputs the loss data to an external system. Therefore, the external system can recognize a loss of the switching semiconductor device 51. In a system comprising the semiconductor module 50, accordingly, it is possible to work out a control strategy having the highest energy efficiency in a whole system based on the loss data obtained from the semiconductor module 50 and a value of a loss obtained from another subsystem.

While the loss data indicative of the loss generated by one switching operation of the bipolar transistor 51a are output to the outside in the seventh embodiment, the loss generated by one switching operation of the bipolar transistor 51a may be multiplied by a switching frequency thereof to obtain a loss generated in one second and to output loss data indicative of the loss to the outside.

In the same manner as the semiconductor module 50 according to the seventh embodiment, moreover, also in the case in which the switching semiconductor device 51 is employed in place of the switching semiconductor device 11 and the switching power circuit 59 shown in FIG. 25 is constituted in each of the semiconductor modules 15, 20, 27, 30 and 40, it is a matter of course that the effects described above can be obtained in each of the semiconductor modules. As a characteristic value of a load in this case, a voltage generated on both ends of the capacitor 56 is employed, for example. The output voltage Vt of the battery 58 and the switching frequency of the bipolar transistor 51a in the switching semiconductor device 51 are obtained from a result measured by the voltage measuring section. Therefore, the loss calculating section can calculate the voltage generated on both ends of the capacitor 56.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module, comprising;
   a switching semiconductor device which is accommodated in one package,
   wherein loss data indicative of a power loss generated in said switching semiconductor device is output as a data signal to an outside of said package;
   a storage section inside the package and configured to store at least one characteristic value of said switching semiconductor device and said loss data corresponding to the at least one characteristic value,
   wherein said loss data stored in said storage section is output to the outside of the package.

2. The semiconductor module according to claim 1, wherein said loss data corresponding to a characteristic value, out of said at least one characteristic value of said switching semiconductor device, is required by a system which is external to said package and is output from said storage section to said system.

3. The semiconductor module according to claim 2, wherein said system can directly read data from said storage section.

4. The semiconductor module according to claim 1, wherein said storage section stores a temperature of said switching semiconductor device as said at least one characteristic value of said switching semiconductor device,
   wherein the semiconductor module further comprises a temperature measuring section, in said package, configured to measure said temperature of said switching semiconductor device, and
   said loss data corresponding to said temperature of said switching semiconductor device which is measured by said temperature measuring section is output from said storage section to the outside of the package.

5. A semiconductor module, comprising;
   a switching semiconductor device which is accommodated in one package,
   wherein loss data indicative of a power loss generated in said switching semiconductor device is output as a data signal to an outside of the package;
   a storage section inside the package configured to store at least one characteristic value of a load of said switching semiconductor device and said loss data corresponding to the at least one characteristic value, wherein said loss data stored in said storage section is output to the outside of the package;

wherein said storage section stores a temperature of said switching semiconductor device, said at least one characteristic value of said load and said loss data, said temperature, said at least one characteristic value and said loss data are in corresponding relation to each other, wherein the semiconductor module further comprises a temperature measuring section, in said package, configured to measure said temperature of said switching semiconductor device, and said loss data corresponding to said temperature of said switching semiconductor device which is measured by said temperature measuring section is output from said storage section to the outside of the package.

6. A semiconductor module, comprising;

a switching semiconductor device which is accommodated in one a package, wherein loss data indicative of a power loss generated in said switching semiconductor device is output as a data signal to an outside of said package;

wherein said switching semiconductor device is provided with a switching semiconductor element, the semiconductor module further comprising in said package:

a voltage measuring section configured to measure a voltage to be applied to said switching semiconductor element;

a current measuring section configured to measure a current to flow into said switching semiconductor element; and a loss calculating section configured to obtain said loss data based on said voltage measured by said voltage measuring section and said current measured by said current measuring section.

* * * * *